(12) United States Patent
Long et al.

(10) Patent No.: US 8,581,336 B2
(45) Date of Patent: Nov. 12, 2013

(54) POWER TRENCH MOSFET RECTIFIER

(76) Inventors: Tao Long, Shanghai (CN); Yiming Wang, Shanghai (CN); Zhongyuan Jin, Shanghai (CN)

( * ) Notice: Subject to any disclaimer, the term of this patent is extended or adjusted under 35 U.S.C. 154(b) by 469 days.

(21) Appl. No.: 12/794,110

(22) Filed: Jun. 4, 2010

(65) Prior Publication Data

US 2011/0284953 A1 Nov. 24, 2011

(30) Foreign Application Priority Data

May 21, 2010 (CN) .......................... 2010 1 0181358

(51) Int. Cl.
*H01L 29/78* (2006.01)

(52) U.S. Cl.
USPC ............... 257/331; 257/332; 257/401

(58) Field of Classification Search
None
See application file for complete search history.

(56) References Cited

U.S. PATENT DOCUMENTS

| 5,818,084 | A | 10/1998 | Williams et al. |
| 6,236,099 | B1 | 5/2001 | Boden, Jr. |
| 8,022,474 | B2 * | 9/2011 | Haeberlen et al. ............ 257/331 |
| 2008/0087896 | A1 | 4/2008 | Chiola |
| 2009/0278198 | A1 * | 11/2009 | Cao et al. ...................... 257/330 |
| 2010/0264488 | A1 * | 10/2010 | Hsieh ............................ 257/334 |

\* cited by examiner

*Primary Examiner* — Johannes P Mondt

(57) ABSTRACT

A trench MOSFET rectifier includes oxide layers having different thicknesses formed in different regions of the devices. The rectifying device also includes a source region of first conductivity type at a surface of each mesa region and a body region of a second conductivity type beneath each source region. The rectifying device also includes a dielectric layer lining the bottom and sidewall surfaces of the trenches, the portion of the dielectric layer on the bottom surface being thicker than the portion on the sidewall surface. A doped region underlies each of the first plurality of trenches. A polycrystalline silicon region filling each of the first plurality of trenches to form a gate region in each trench. A conductive material fills a plurality of contact trenches and forms ohmic contacts with the source region, body region, and gate region.

11 Claims, 24 Drawing Sheets

US 8,581,336 B2

POWER TRENCH MOSFET RECTIFIER

CROSS-REFERENCES TO RELATED APPLICATIONS

This application claims priority to Chinese Patent Application No. 201010181358.0, filed May 21, 2010, by inventors Tao Long et. al., commonly assigned and incorporated in its entirety by reference herein for all purposes.

BACKGROUND OF THE INVENTION

Embodiments of the present invention relate generally to semiconductor devices. More particularly, some embodiments of the invention relate to a power semiconductor rectifier device and a method of making the device.

Power semiconductor rectifiers are used extensively in power supplies and power converters. In order to provide a DC voltage, diode rectification has been used for many years in switching mode power supplies. However, the scaling down of semiconductor technology calls for lower voltage and larger current power supply. A PN diode is typically can have a forward voltage drop of around 0.6-0.8V. For 3V output application, this limits the theoretical efficiency of a DC/DC power converter. For a 2V application, the efficiency is even lower and becomes unacceptable. Because the diode forward drop voltage cannot be scaled down further, diode rectification can no long meet the smallness, thinness, and high-efficiency requirements desired by the consumer. Furthermore, since circuit loss is proportional to output current, diode rectification suffers from excessive loss with large output current.

As an alternative, a Schottky diode can provide a lower voltage drop, from 0.2-0.4 volts, for example. However, fabricating Schottky diodes is a more complex process and tends to increase the cost of the device. Thus, even though widely used, conventional rectifiers, such as PN diodes or Schottky diodes, suffer from many limitations. Theses limitations include high cost and complex circuit. More details of these and other limitations are described below.

Therefore, devices and methods for improved semiconductor rectifying devices are highly desirable.

BRIEF SUMMARY OF THE INVENTION

As described above, conventional rectifying devices suffer from various limitations. Embodiments of the present invention provide improved power semiconductor rectifier devices and fabrication methods.

Some embodiments of the invention provide a trench MOSFET rectifier device. The trench MOSFET rectifier includes oxide layers having different thicknesses formed in different regions of the devices, and a p-dope region at the bottom of the trench is used to enhance the reverse breakdown voltage. The rectifying device also includes a conductive material filling contact trenches for connecting the source region, body region, and gate region. In an embodiment, a heavily dope region of second conductivity type is formed under the contact trenches.

In an embodiment, a trench MOSFET rectifier device includes a semiconductor substrate of a first conductivity type, for example, N-type. A first plurality of trenches are made in the semiconductor substrate and spaced by a plurality of mesa regions. The rectifying device also includes a source region of first conductivity type at a surface of each mesa region and a body region of a second conductivity type, e.g., P-type, beneath each source region. The rectifying device also includes a dielectric layer lining the bottom and sidewall surfaces, respectively, of each of the first plurality of trenches. The portion of the dielectric layer on the bottom surface is thicker than the portion on the sidewall surface. A doped region underlies each of the first plurality of trenches. A trench gate region in each trench is formed by a polycrystalline silicon region filling each of the first plurality of trenches. A conductive material fills a second plurality of trenches, which are the contact trenches, and forms ohmic contacts with the source region, body region, and gate region. Additionally, the rectifying device also has a first electrode, the source electrode, in contact with the conductive material and a second electrode, the drain electrode, on a second surface of the substrate opposite from the first surface.

In an embodiment, the rectifying device also includes a doped region of the second conductivity type under the bottom surface of the trenches and spaced apart from the body region. In an embodiment, this doped region provide higher oxidation rate and aids in the formation of the thicker oxide at the bottom of the trenches. In another embodiment, the dielectric layer lining the sidewall surface of said trench is approximately 200-800 Å and the dielectric layer lining the bottom surface of said trench is approximately 1000-5000 Å. In another embodiment, the rectifying device also has a termination region with at least one guard ring of the second conductivity type.

In another embodiment, the rectifying device also includes a second plurality of trenches which are used for contact formation. A subset of the second plurality of trenches are etched through the source regions and into the body regions, whereas another subset are etched into the polysilicon gate regions. In another embodiment, a surface of the polysilicon gate region is higher than a surface of the source region. In another embodiment, the conductive material includes tungsten. In yet another embodiment, the polysilicon gate region is doped in the second conductivity type.

According to some embodiments, a method for fabricating a trench MOSFET rectifying device includes forming a trench MOSFET and forming oxides having different thicknesses along the sidewalls and the bottom of the trenches. The method also includes using a conductive material to fill contact trenches for connecting the source region, body region, and gate region. In an embodiment, a heavily dope region of second conductivity type under the second trenches. Details of the method are described further below.

A further understanding of the nature and advantages of embodiments according to the present invention may be realized by reference to the remaining portions of the specification and the drawings.

DETAILED DESCRIPTION OF THE INVENTION

As described above, PN diodes with high turn-on voltages are unsuited for modern power semiconductor rectifiers applications. As an alternative, Schottky diodes are characterized by a low turn-on voltage and fast turn off, but Schottky diodes have several drawbacks. For example, Schottky diodes rectifiers tend to have high leakage current under high reverse voltage due to "barrier height lowering effect". This will cause high power dissipation and reliability problems. Further, when the reverse blocking capability is increased to 200V, the forward drop of the Schottky rectifier can approach that of a P-i-N rectifier, making them generally unacceptable for use in high-voltage power circuits. On the other hand, a P-i-N rectifier has its own drawbacks. The P-i-N rectifier is minority carriers device which produces a poor reverse recovery characteristic.

As a result, more and more attention is paid to synchronous rectification method using a synchronous rectifier (SR) or an MOSFET-based rectifier. In some examples, an SR uses a power MOSFET in combination with a built-in junction diode to replace a PN diode or a Schottky diode in power supplier and controllers for current rectification. These rectifying devices are also used as shunting device to prevent device conditions such as snap-back or latch-up, which can be caused by the storage of a forward-biased PN junction. However, conventional MOSFET-based rectifier tend to suffer from various limitations. For example, some of these devices can not sustain the high voltage or high power requirement due to oxide breakdown or junction breakdown conditions.

Embodiments of the present invention provide improved power semiconductor rectifier devices and fabrication methods. The description below makes reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

Figure 1:
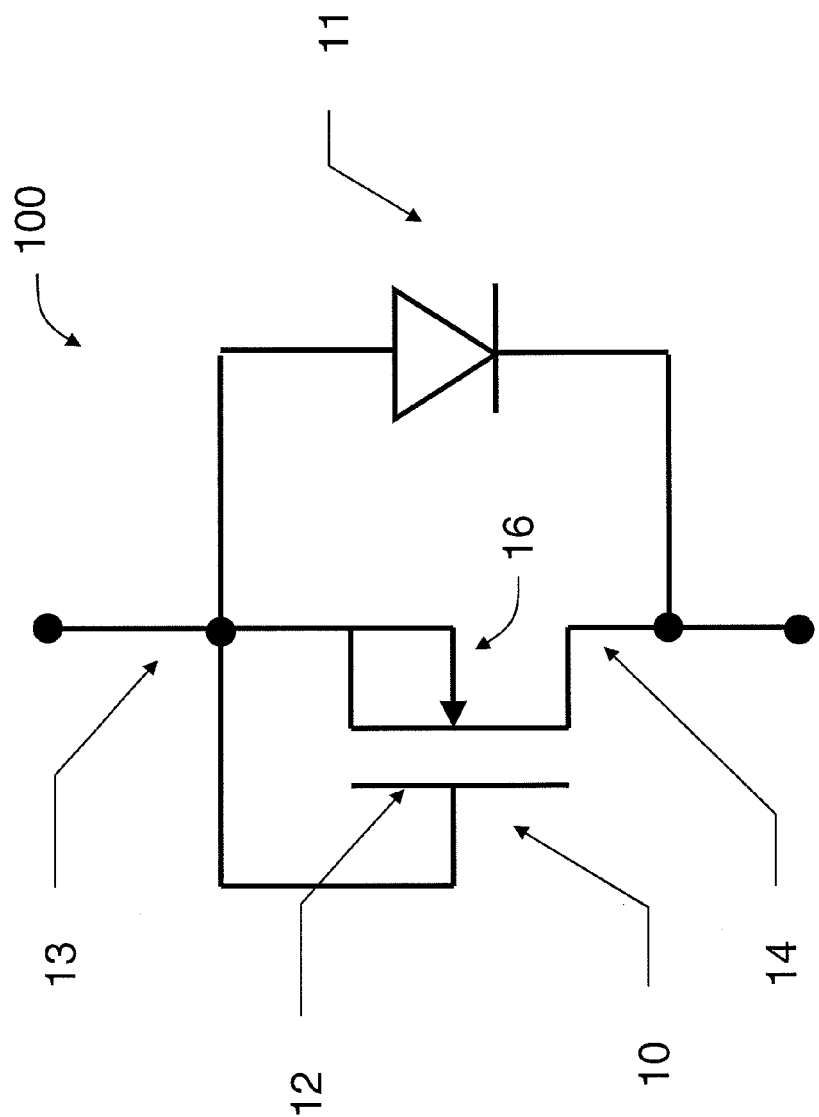
FIG. 1 is an simplified schematic diagram of a power rectifier device according to an embodiment of the present invention.

FIG. 1 is an simplified schematic diagram of a power rectifier device 100 according to an embodiment of the present invention. As shown, rectifier device 100 includes MOSFET transistor 10, with a source 13, a gate 12, and a substrate (or body) terminal 16 connected together. A diode device 11 has an anode connected to body terminal 16 and source terminal 13. Diode device 11 also has a cathode connected to a drain 14 of MOSFET 10. In a specific embodiment, diode device 11 is a parasitic diode between body region 16 and drain region 14 of MOSFET 10.

Rectifier device 100 can provide a lower turn-on voltage than a conventional junction PN diode. In some embodiments, rectifier device 100 can have a turn-on voltage of about 0.3-0.5V, whereas conventional junction PN diodes often have turn-on voltages of about 0.6-0.8 V. As is know, PN junctions in a semiconductor device can often lead to snap-back and latch-up conditions, which can result from the storage of minority carriers in a forward-biased PN junction. Accordingly, rectifier device 100 is often useful when connected to shunt current from a conventional PN diode, or an MOSFET.

Figure 2:
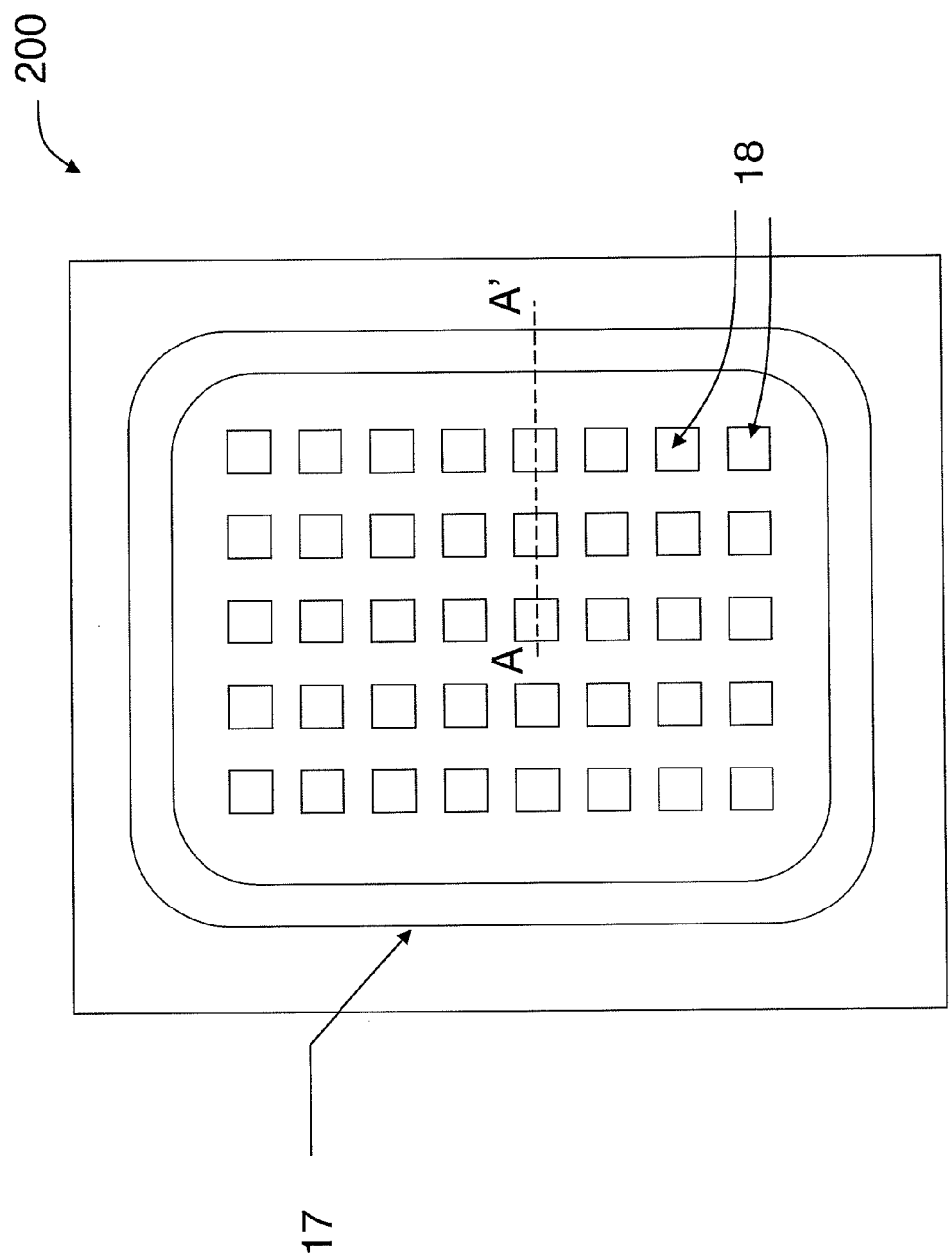
FIG. 2 is a top view of a power rectifier device according to an embodiment of the present invention.

FIG. 2 is a top view of an MOSFET rectifier device 200 according to an embodiment of the present invention. As shown, rectifier device 200 includes multiple trenches 18 arranged in a two-dimensional array with trench gates for the MOSFET. Rectifier device 200 also has a guard ring 17. Rectifier device 200 is described in more detail with reference to a cross-sectional view, along cut line A-A', of a portion of the device as shown in FIG. 3.

Figure 3:
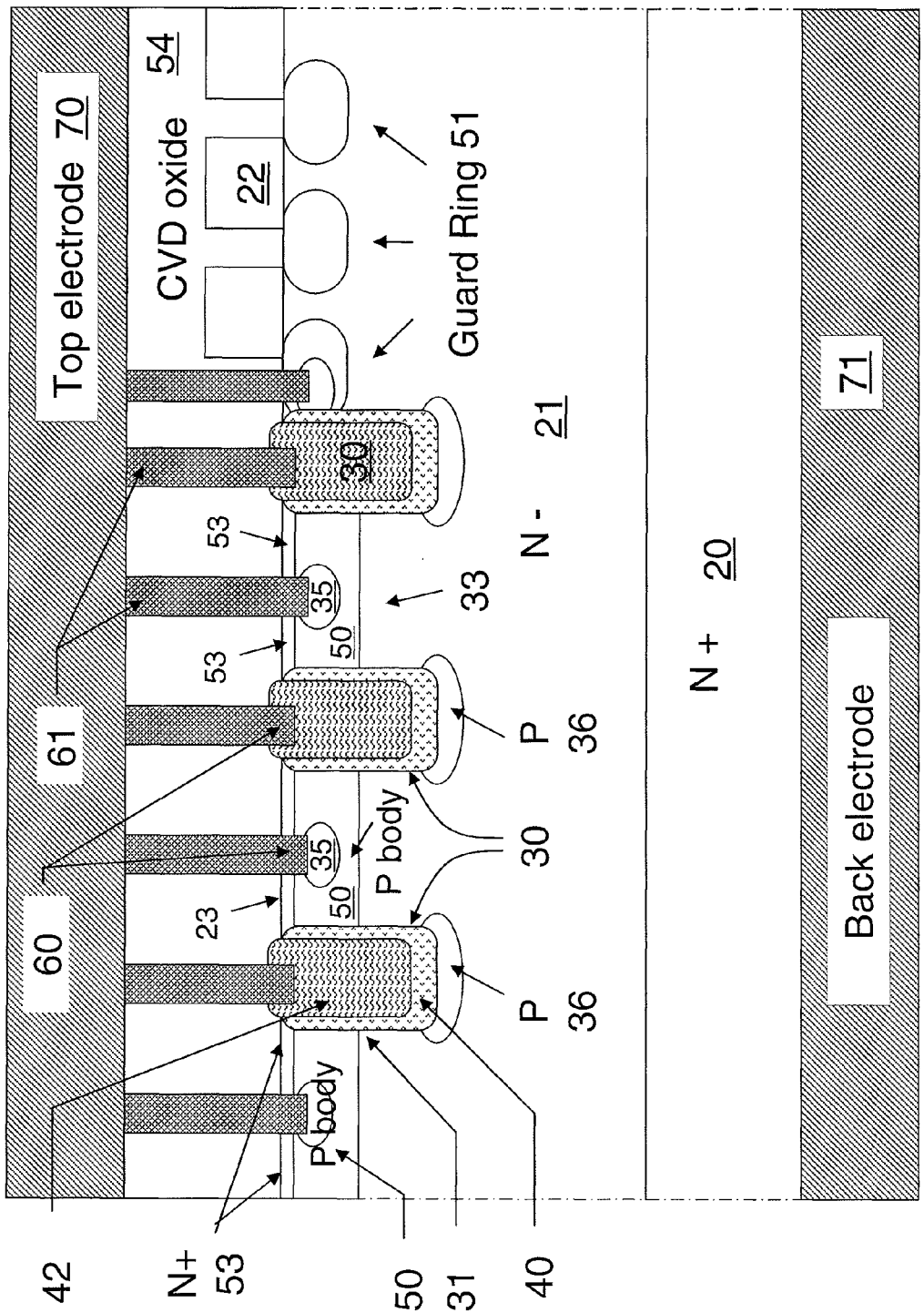
FIG. 3 is a cross-sectional view of a portion of the rectifier device of FIG. 2 according to an embodiment of the present invention.

FIG. 3 illustrates a portion of rectifier device 200 of FIG. 2 and includes a semiconductor substrate of a first conductivity type which, in this example, is N type. It is noted that a rectifier device can be formed by reversing the dopant types illustrated in this example. As shown in FIG. 3, the substrate includes a heavily doped N-type layer 20 and a lightly doped N-type layer 21. In an embodiment, N+ region 20 serves as a drain region of the device. The device also includes a first plurality of trenches 30 along a first surface 23 of the semiconductor substrate and spaced apart by a plurality of mesa regions 33. The rectifier device has a source region 53 of first conductivity type (N-type) at a surface of each mesa region and a body region 50 of a second conductivity type (P-type) beneath each source region 53.

FIG. 3 also shows a dielectric layer lining the bottom and sidewall surfaces, respectively, of each of the first plurality of trenches 30. As can be seen, the portion of the dielectric layer 40 on the bottom surface is thicker than the portion of dielectric layer 31 on the sidewall surface. In some embodiments, the dielectric layer includes thermal oxide. As an example, the dielectric layer lining the sidewall surface of the trench is approximately 200-800 A and the dielectric layer lining the bottom surface of said trench is approximately 1000-5000 A. Underlying each trench 30 is a P-type doped region 36, which is space apart from the body region and serves to enhance the reverse breakdown voltage of the device. A polycrystalline silicon region 42 is shown filling each of trenches 30. In some embodiment, polycrystalline silicon region 42 is doped N-type. In other embodiments, polycrystalline silicon region 42 can be doped P-type, which can provide a different work function for the gate of the trench MOSFET. In some embodiment, as shown in FIG. 3, the top surface of polycrystalline silicon region 42 is higher than the surface of the source regions 53.

The rectifier device in FIG. 3 also has a second plurality of trenches 60 etched through a dielectric layer 54 overlying the first surface 23 of the semiconductor substrate. Some of trenches 60 are etched through source region 53 and into body region 50. A subset of trenches 60 are etched into polysilicon gate material 42 for making contacts. A conductive material 61 (e.g., tungsten) fills the second plurality of trenches. Some of conductive material 61 also fills the trenches 60 in polysilicon gate material 42. In this arrangement, conductive material 61 is in ohmic contact with source region 53, body region 50, and gate region 30. In some embodiments, a heavily doped P-type region 35 is formed underneath each of trenches 60 that are extended into body region 50 for forming an ohmic contact with the body region. A first electrode 70 is formed overlying and in contact with the conductive material 61. A second electrode 71 is formed on a second surface (the back surface, in this example) of the substrate opposite from the first surface.

As described above, the rectifier device in FIG. 3 includes a group of trench MOSFETs with polysilicon gates in the trenches. A top electrode 70 is coupled to the source, body, and gate of the MOSFET, and a bottom electrode 71 is coupled to the drain of the MOSFET. In this embodiment, the contacts to the source region and body region are made through a trench etched through the source region and into the body region.

In power rectifier applications, the trench device is exposed to high electric field regions located at the trench bottom corners and is susceptible to high blocking voltages. As described above, the device of FIG. 3 has a thicker oxide that can sustain the high voltage at reverse bias. The oxide at trench sidewall is a thinner oxide used as gate oxide which affects the MOSFET channel character at forward biased. Further the P doped region 36 under the bottom of trench further enhances the reverse breakdown voltage of the device.

In some embodiments, guard ring 17 of the rectifier device 200 of FIG. 2 included P-type doped regions surrounding the trench devices 18. In the example of FIG. 3, this is shown as guard ring 51, which has three P-type doped regions. One of the doped regions is connected to top electrode 70 through conductive material 61. In this embodiment, guard ring 51 serves as a termination region for the rectifier device.

Embodiments of the present invention provide methods for fabricating the trench MOSFET rectifier device of FIG. 3. A specific method can be briefly summarized below.

a) forming a field oxide on a surface of a semiconductor substrate having a first conductivity type;
b) defining a first trench area and etching into the field oxide and the semiconductor substrate to form a first plurality of trenches separated by a corresponding plurality of mesa regions;
c) forming a dielectric layer at sidewall and bottom surfaces of the first plurality of trenches.
d) forming a nitride spacer over the sidewalls of the first plurality of trenches;
e) forming a doped region underlying each of the first plurality of trenches;
f) forming a thick dielectric layer at the bottom of the first plurality of trenches;
g) filling the first plurality of trenches with a doped polysilicon material;
h) forming a body region of second conductivity type in each of the mesa regions and the terminal guard ring;
i) forming a source region of first conductivity type at a surface region of each mesa region;
j) forming a second plurality of trenches, some of the trenches etched through the source region into the body region, some of the trenches etched into the polysilicon material filling the trenches;
k) forming a heavily dope region of second conductivity type under the second trenches;
l) filling the second trenches with a tungsten material for forming ohmic contacts with the source region, the body region, and the gate region;
m) forming a first electrode overlying a top surface of the substrate and contacting the tungsten material; and
n) forming a second electrode on a bottom of the substrate.

The above sequence of processes provides a method for forming a trench MOSFET rectifier according to an embodiment of the present invention. As shown, the method uses a combination of processes including a way of using trenches for connecting the source region, body region, and gate region. Other alternatives can also be provided where steps are added, one or more steps are removed, or one or more steps are provided in a different sequence without departing from the scope of the claims herein. It is also understood that the dopant types, N-type or P-type can be reverse to form a device of the opposite type. Further details of the present method are described below with reference to the simplified cross-sectional views in FIGS. 4-24.

Figure 4:
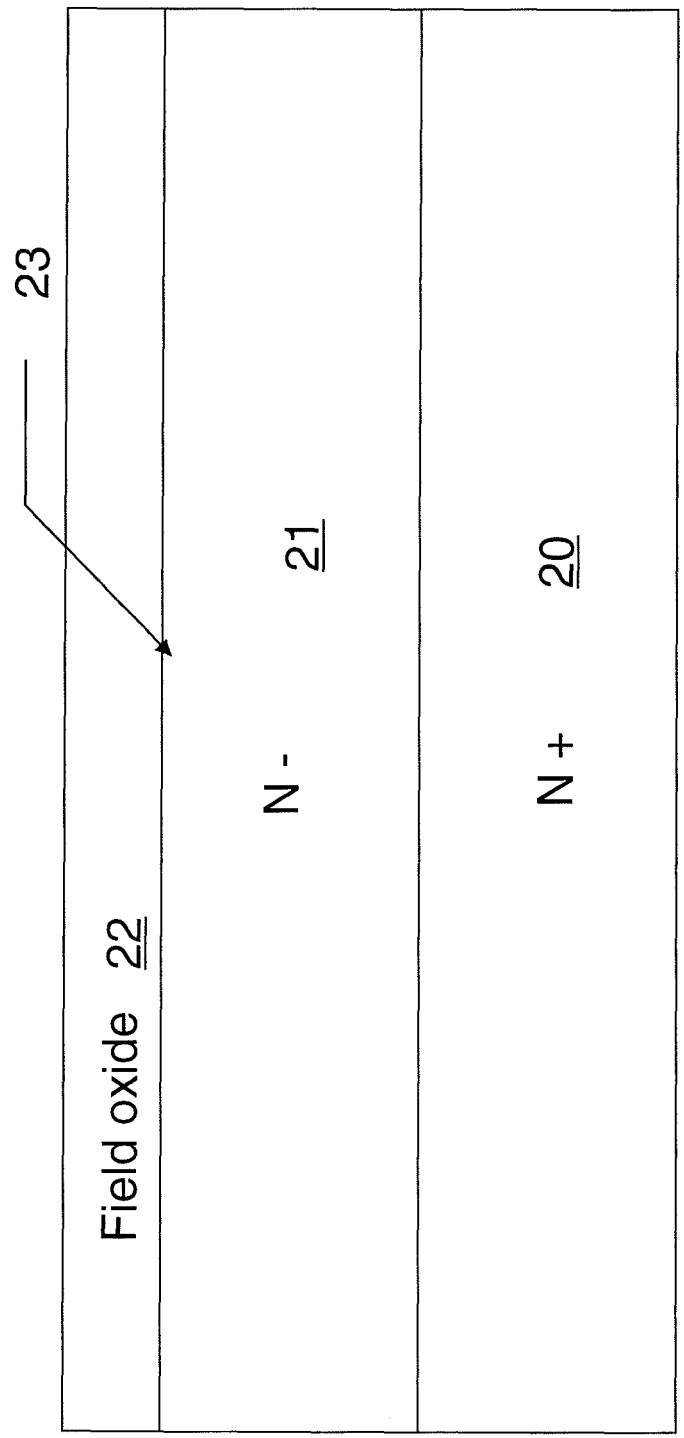
FIGS. 4-24 are simplified cross-sectional views illustrating a method for fabricating the trench MOSFET rectifier device of FIG. 3 according to an embodiment of the present invention.

The cross-sectional view in FIG. 4 shows a semiconductor substrate which includes an N+ doped semiconductor region 20, on which an N− epitaxial layer 21 is formed. Field oxide 22 is grown or deposited on a surface layer 23 of layer 21 to a thickness of 100-1000 nm.

Figure 5:
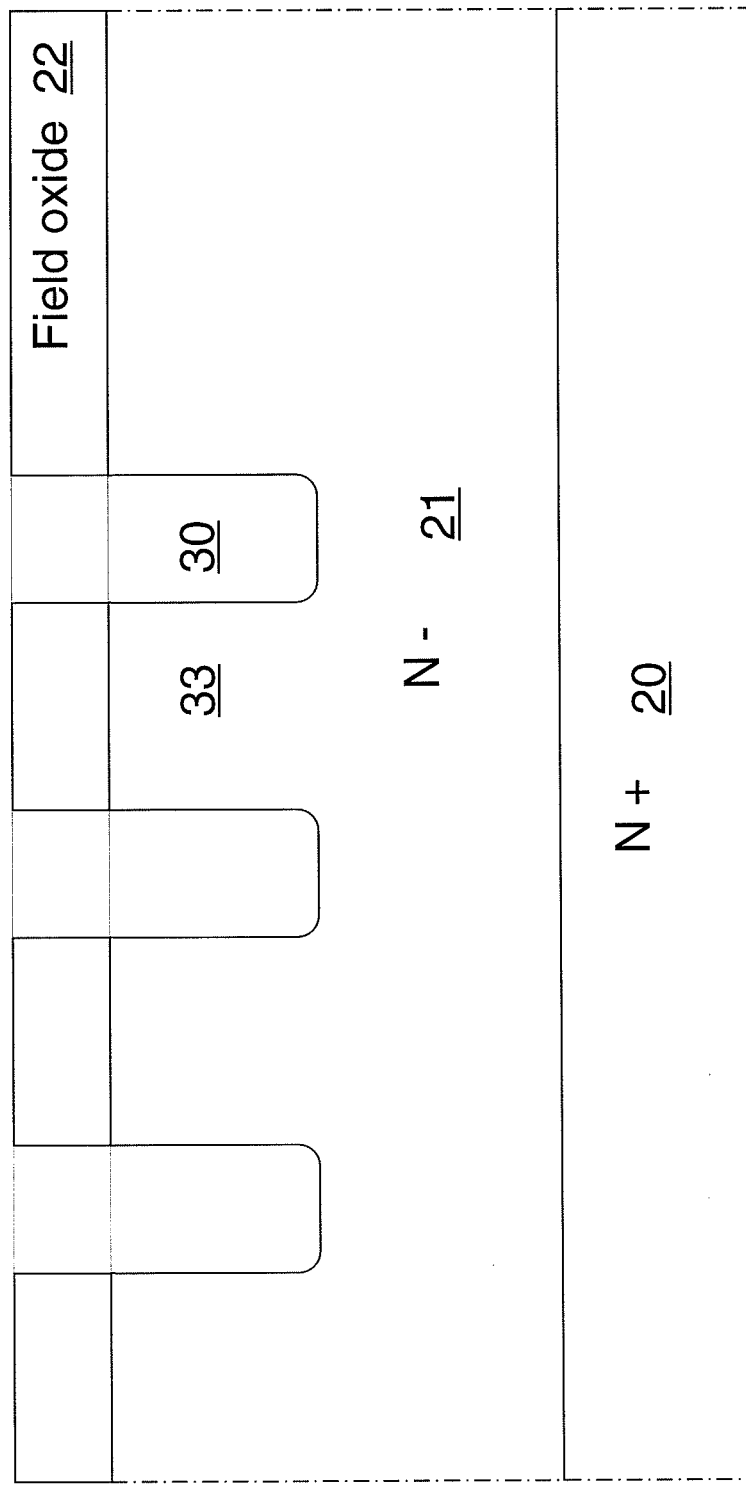

In FIG. 5, first trench regions 30 are formed. Here, a photoresist pattern (not shown) is formed on field oxide layer 22, and field oxide 22 is patterned using etching techniques. After removal of the photoresist layer, another etching process is performed to form first trenches 30 and mesa regions 33. In an embodiment, the trenches are arranged in a two-dimensional array, as shown in FIG. 2. Next, a sacrificial oxide layer with a thickness of approximately 200-1500 Å is grown on the sidewall and bottom surfaces of each trench (not shown). A sacrificial oxide etch is then performed to remove this oxide layer.

Figure 6:
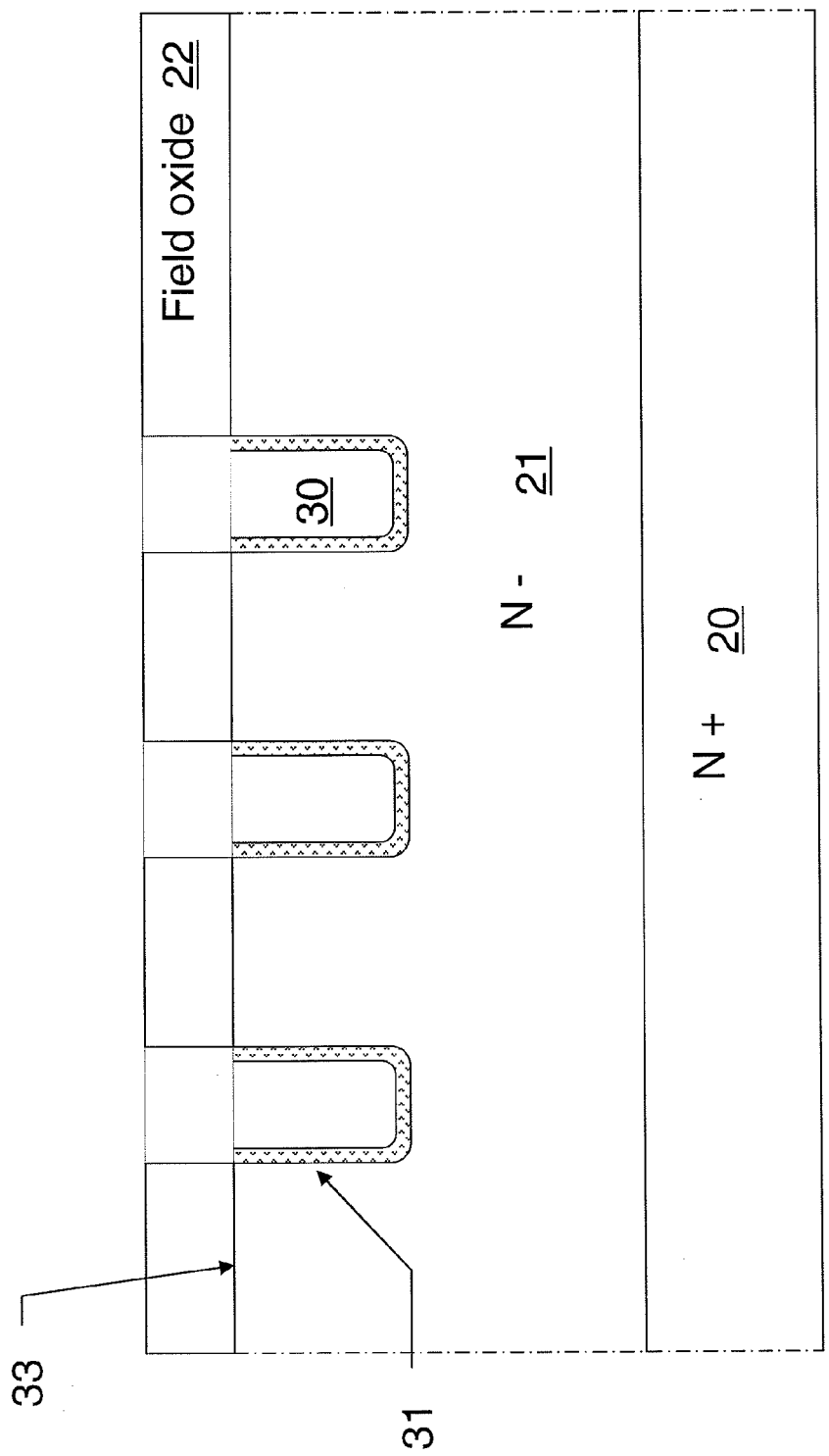
Figure 7:
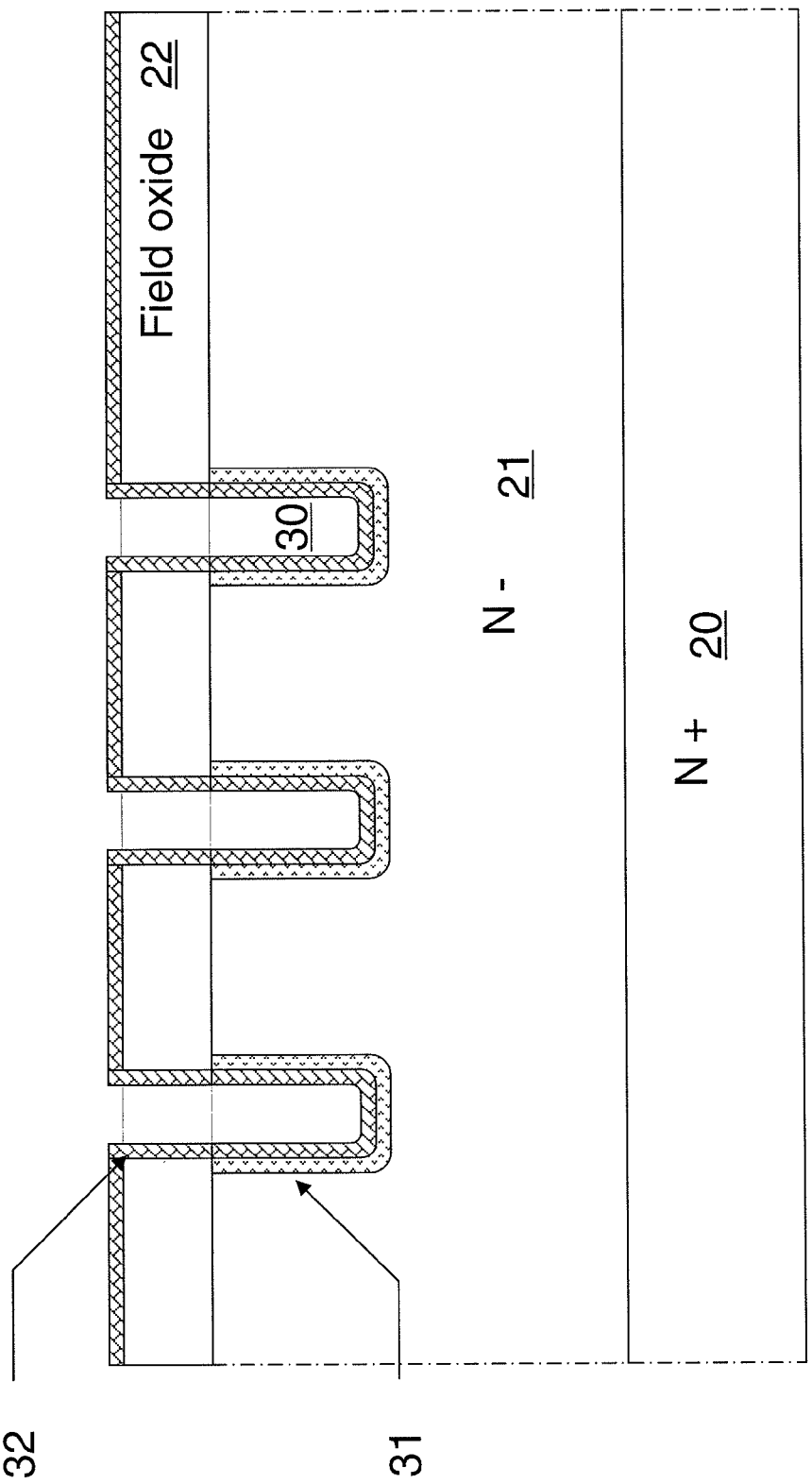
Figure 8:
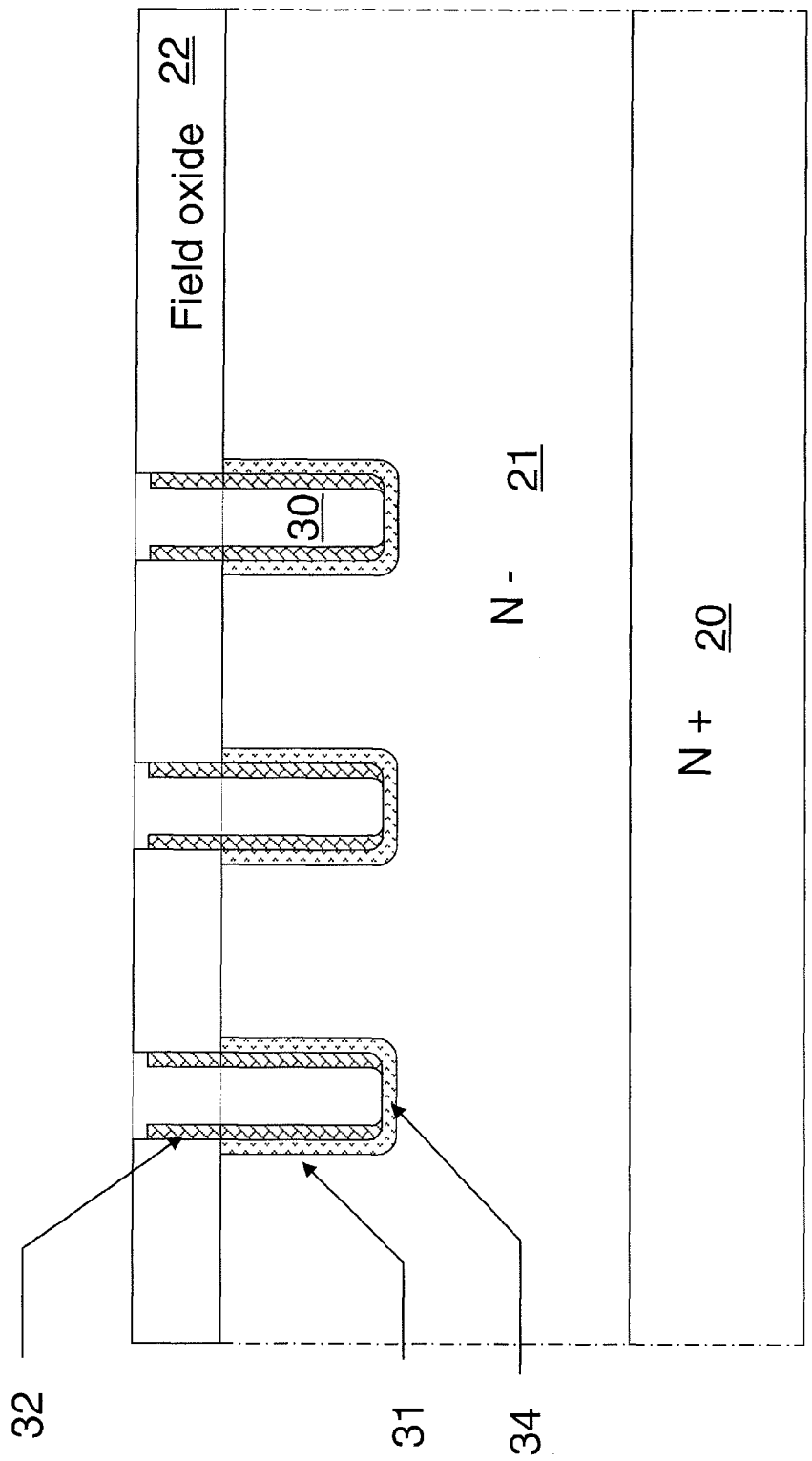

In FIG. 6, an oxide layer 31 is grown to a thickness of approximately 200-800 Å on the sidewalls and bottom surfaces of trenches simultaneously using a wet or dry oxidation process, thereby forming a gate oxide 31. Then, as shown in FIG. 7, a nitride layer 32 is then deposited at a thickness of approximately 100-500 Å over field oxide layer 22 and gate oxide layer 31. In FIG. 8, using a dry nitride etch, nitride layer 32 is removed from the surface of field oxide layer 22 on top of the mesa regions and from the bottom surfaces of trenches 34, leaving the trench nitride layer to only the sidewalls of each trench.

Figure 9:
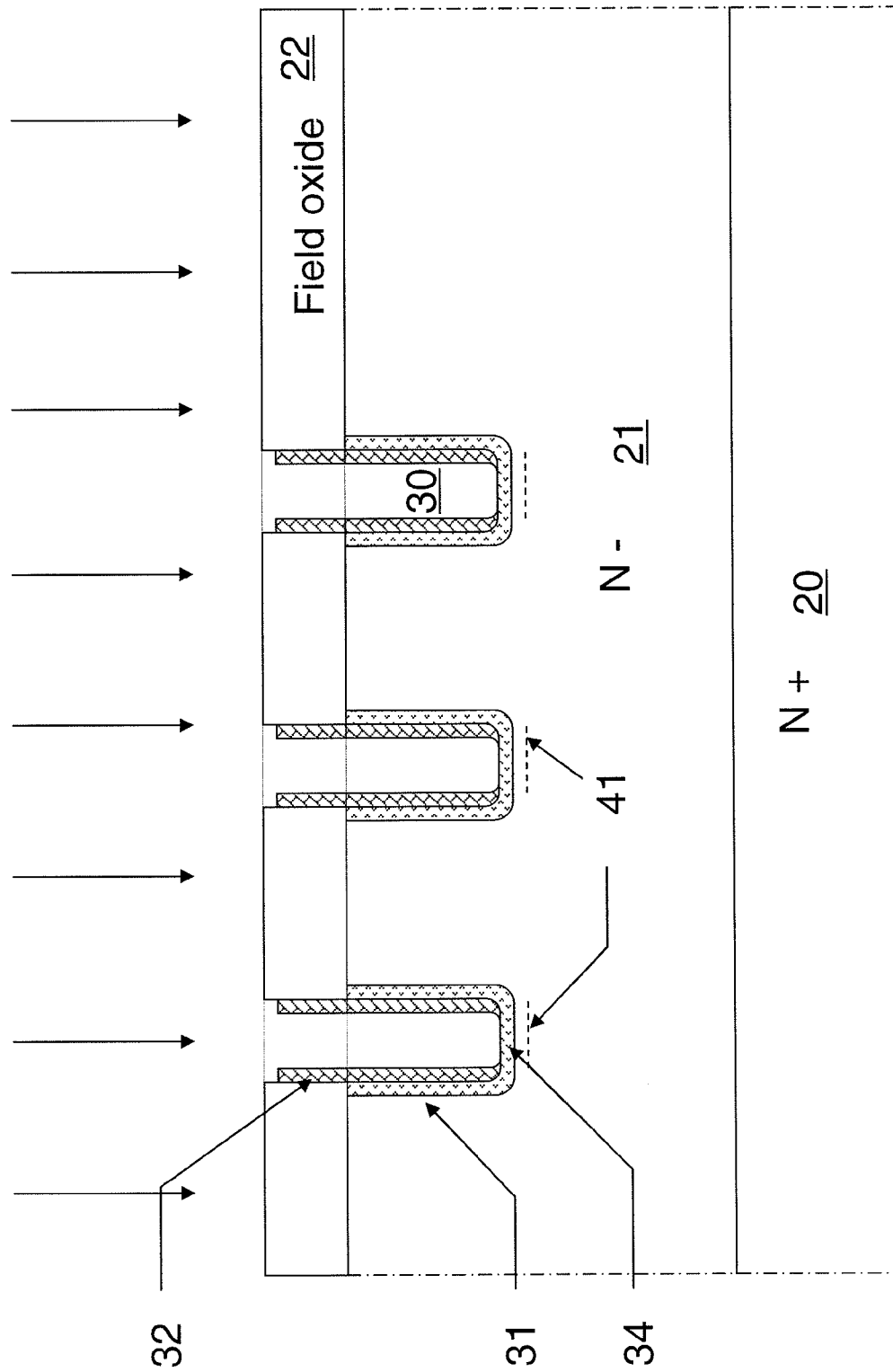
Figure 10:
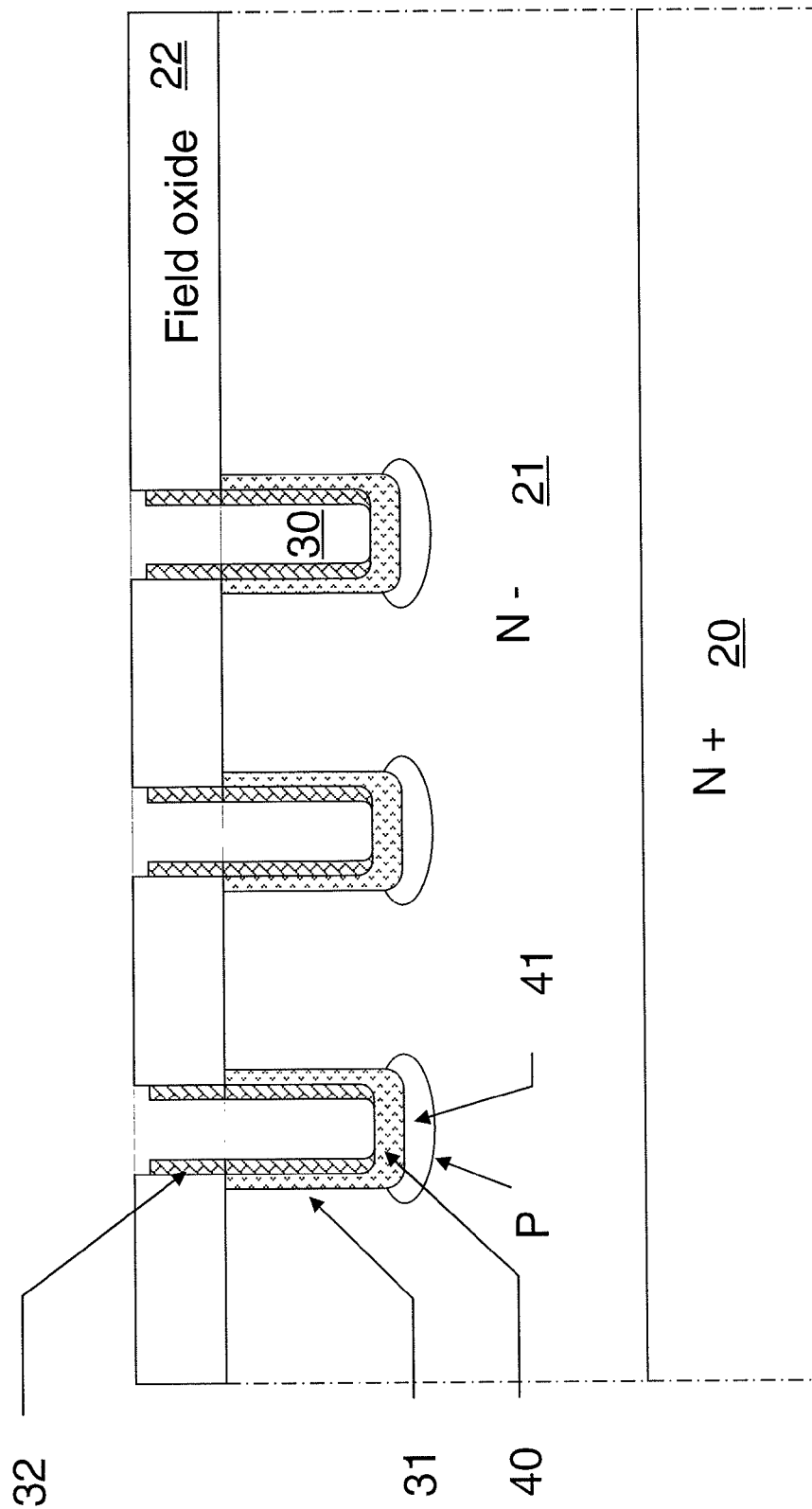

In FIG. 9, a p-type dopant, e.g., boron or $BF_2$ is implanted through the bottom of trenches 34 using the field oxide 22 as a hard mask. This implanted region is shown as 41. In FIG. 10, a thick oxide 40 is grown to a total thickness of approximately 1000-5000 A at the trench bottom and the surface of the substrate using thermal oxide process. During this oxidation process, the side wall of trenches 31 are protected from oxide growth by nitride layer 32.

Figure 11:
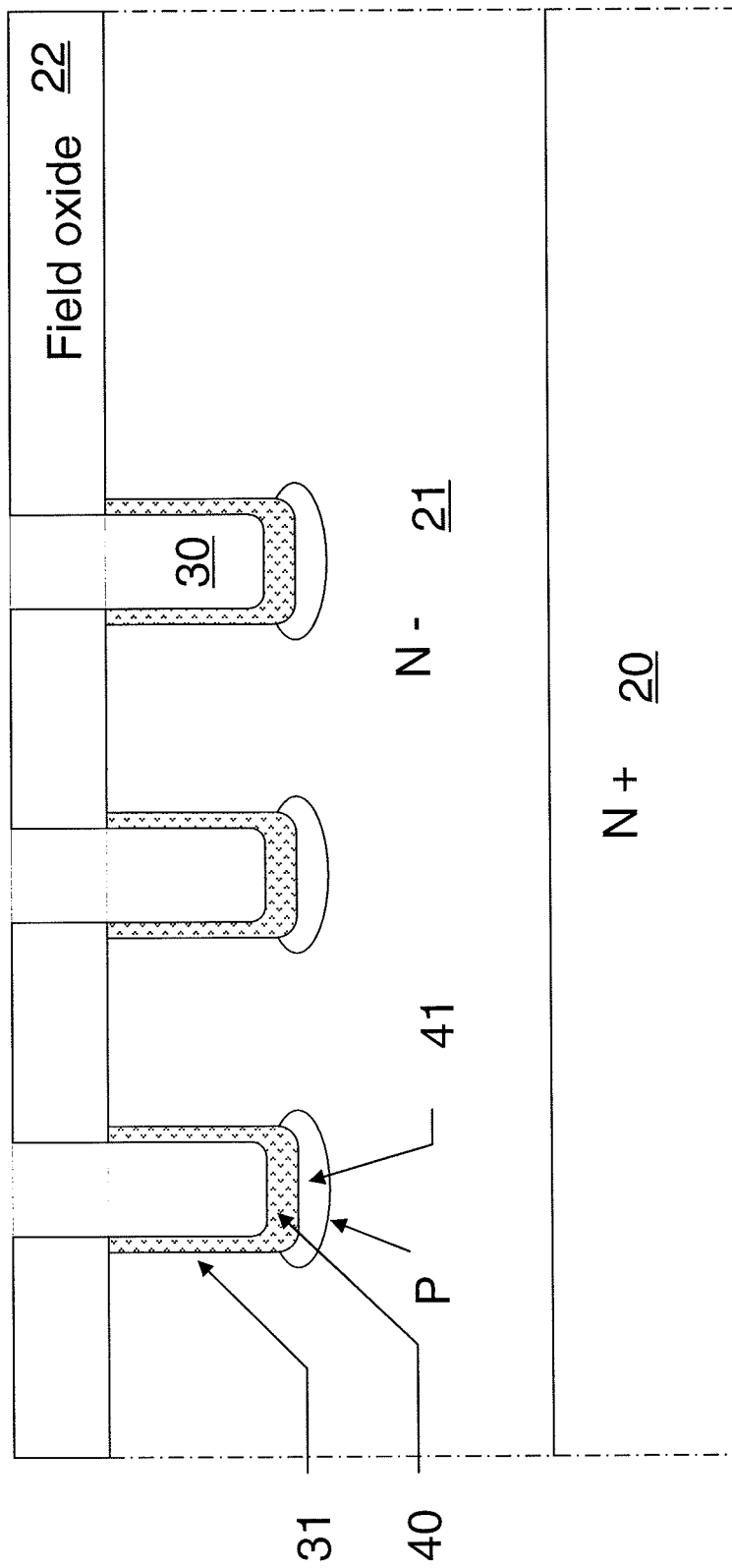
Figure 12:
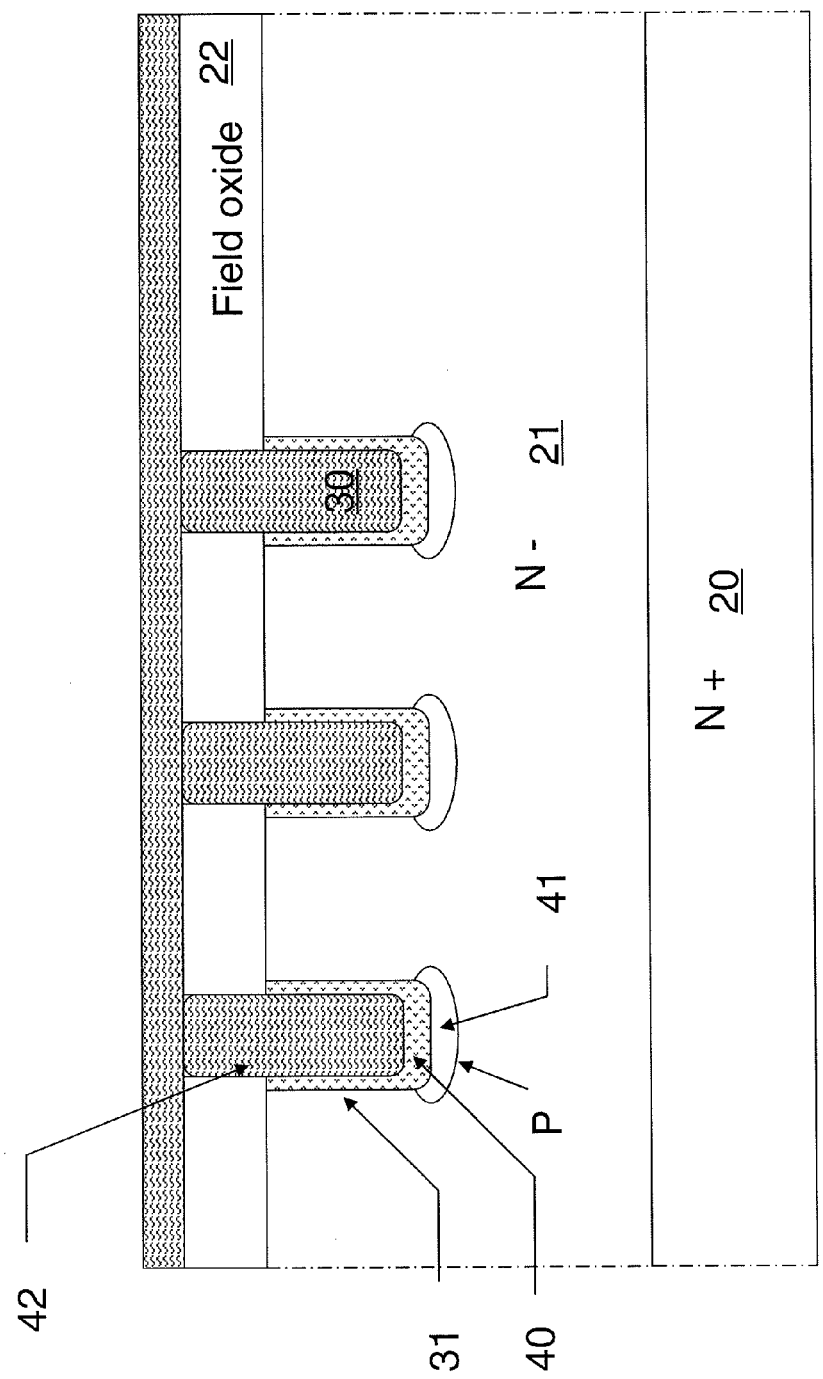
Figure 13:
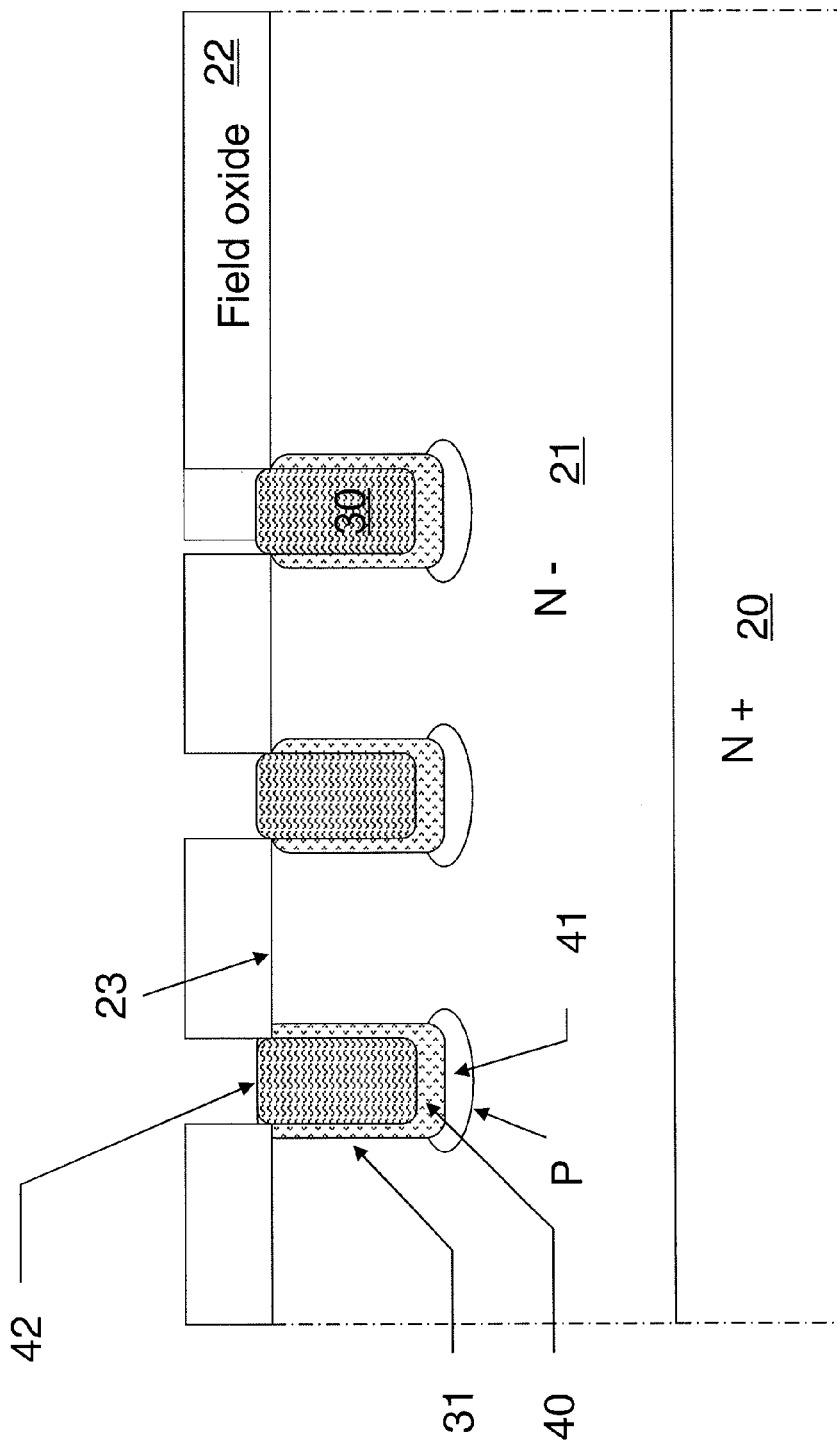

Next, in FIG. 11, nitride layer 32 is removed using a wet etch process. In FIG. 12, an N-type doped polysilicon layer 42 of approximately 10-80 nm thickness is then deposited to fill the trenches. Then, in FIG. 13, a blanket poly etch is carried out using a suitable plasma etch process to remove the polysilicon on the device surface. In the resulting structure shown in FIG. 13, the top of the polysilicon region 42 is below the surface of field oxide 22. In some embodiments, the top of the polysilicon region 42 is above surface 23 of the substrate, which includes epitaxial layer 21 and N+ substrate 20.

Figure 14:
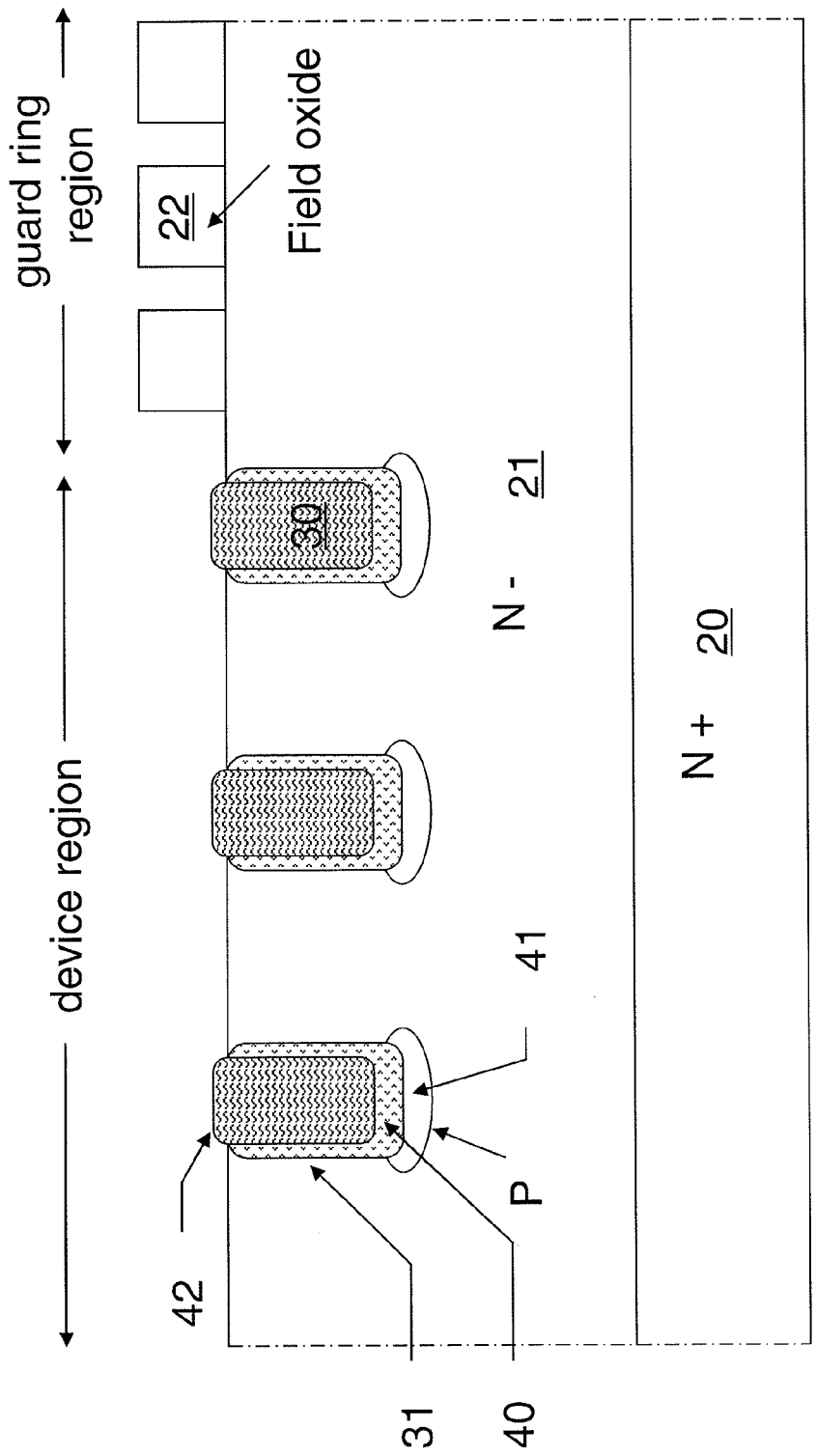
Figure 15:
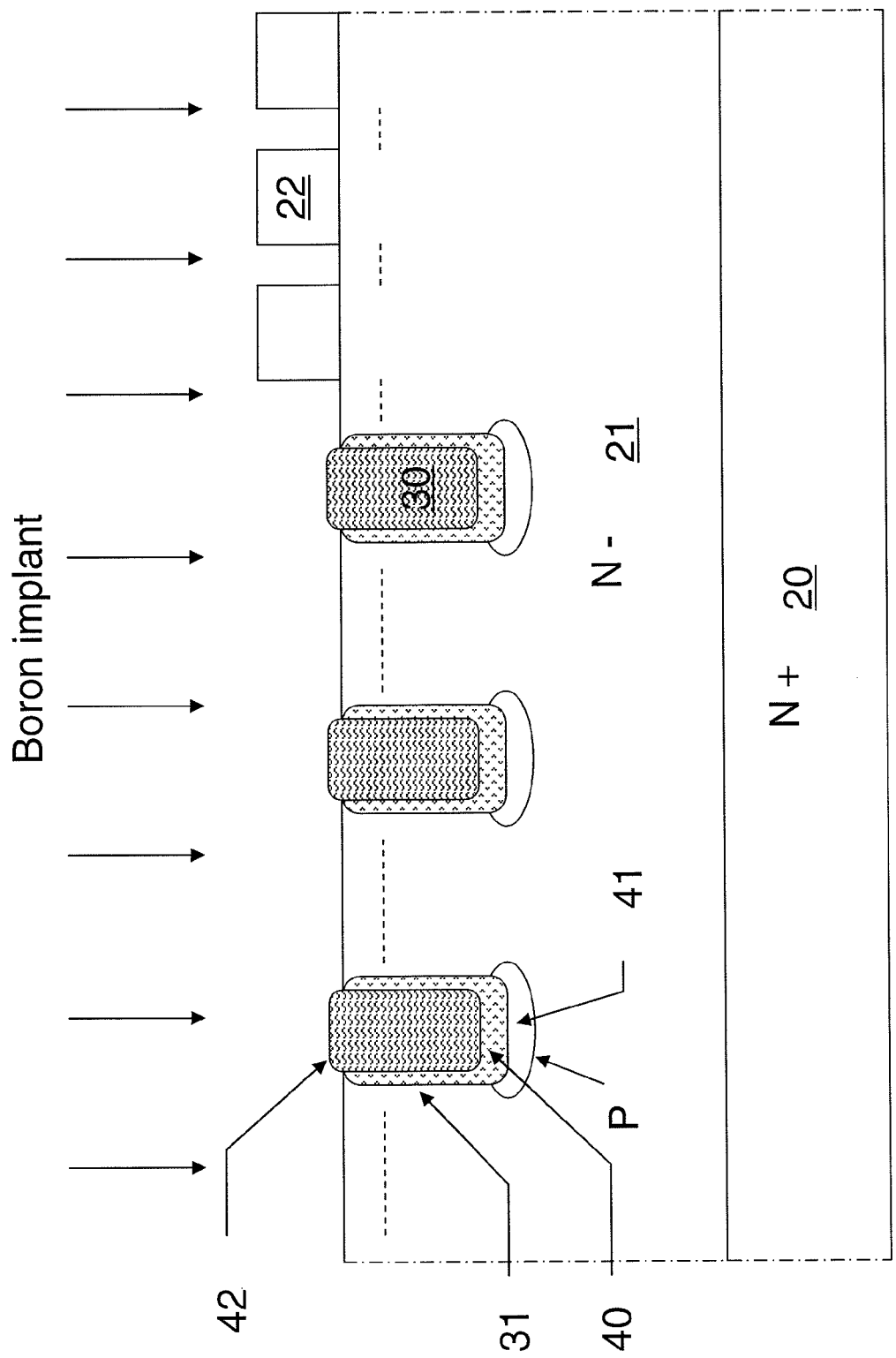
Figure 16:
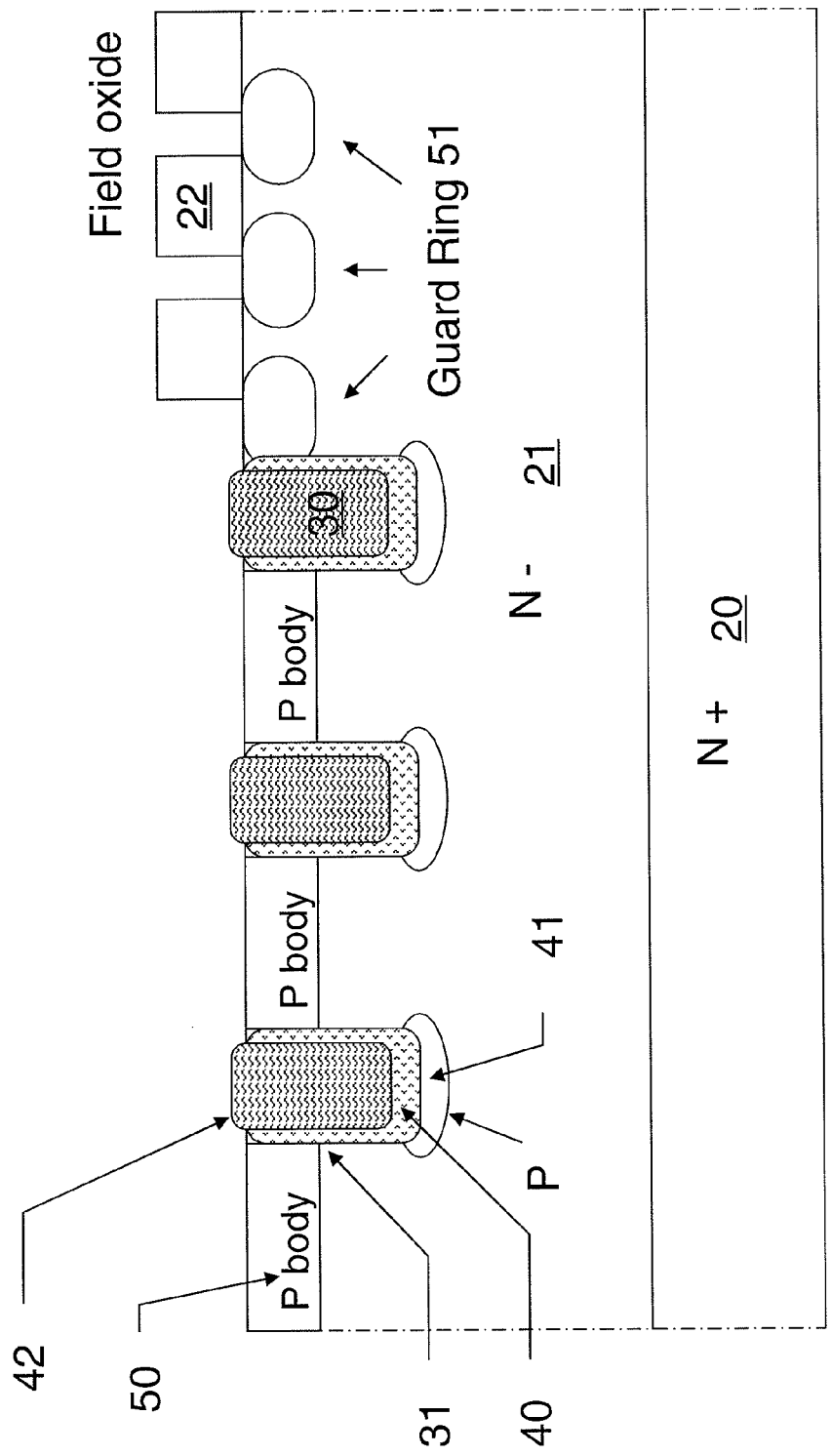

In FIG. 14, a photo resist pattern (not shown) is formed to cover the area outside of the device region and guard ring region. Then the field oxide layer in device region and guard ring region is removed by an etching process. In FIG. 15, after removal of the photoresist, a boron implantation with an energy of 20-80 KeV is applied to the surface of the structure. Then, as shown in FIG. 16, the implanted species are activated and driven to form P-type body region 50 and guard ring region 51.

Figure 17:
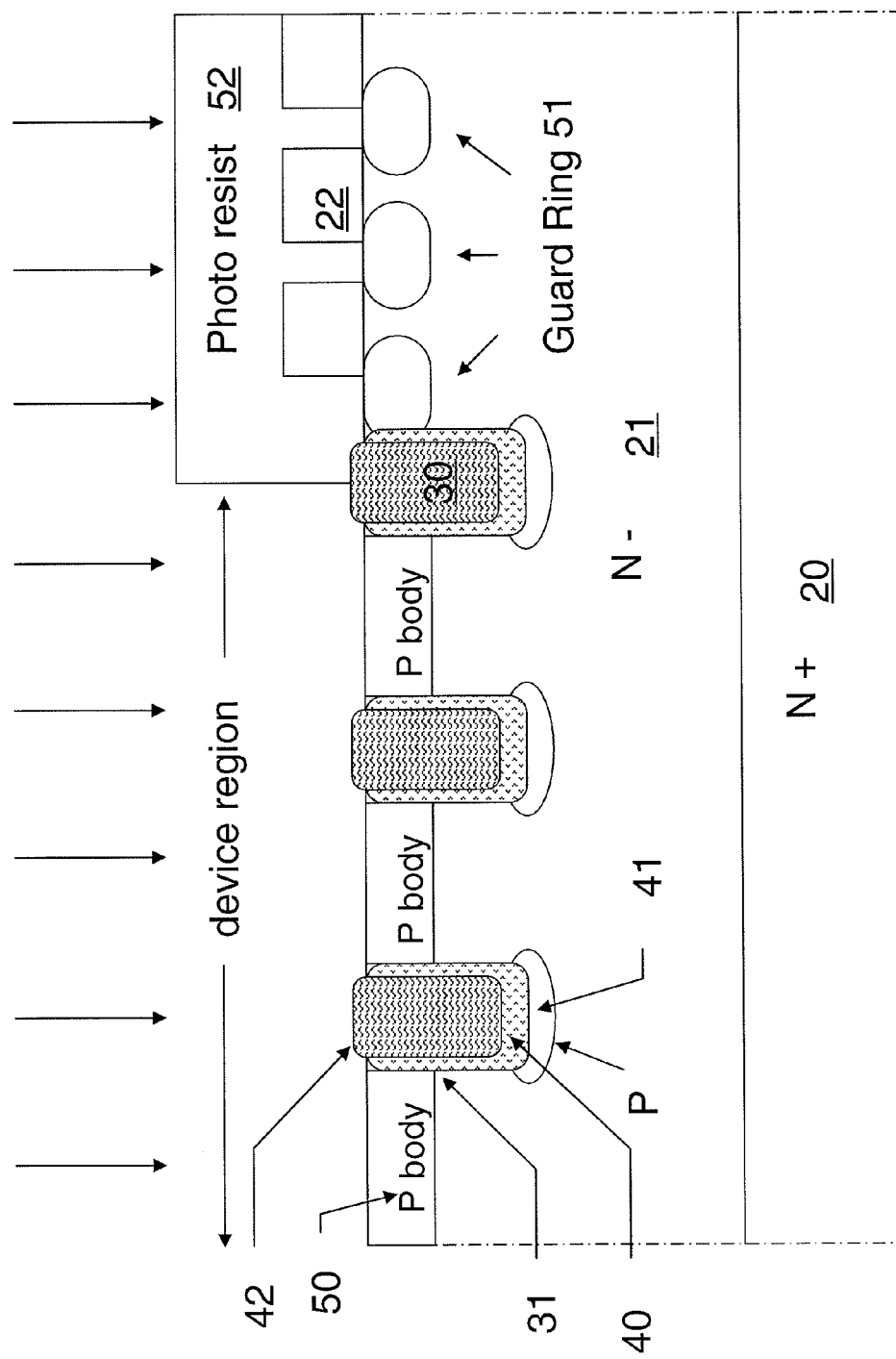
Figure 18:
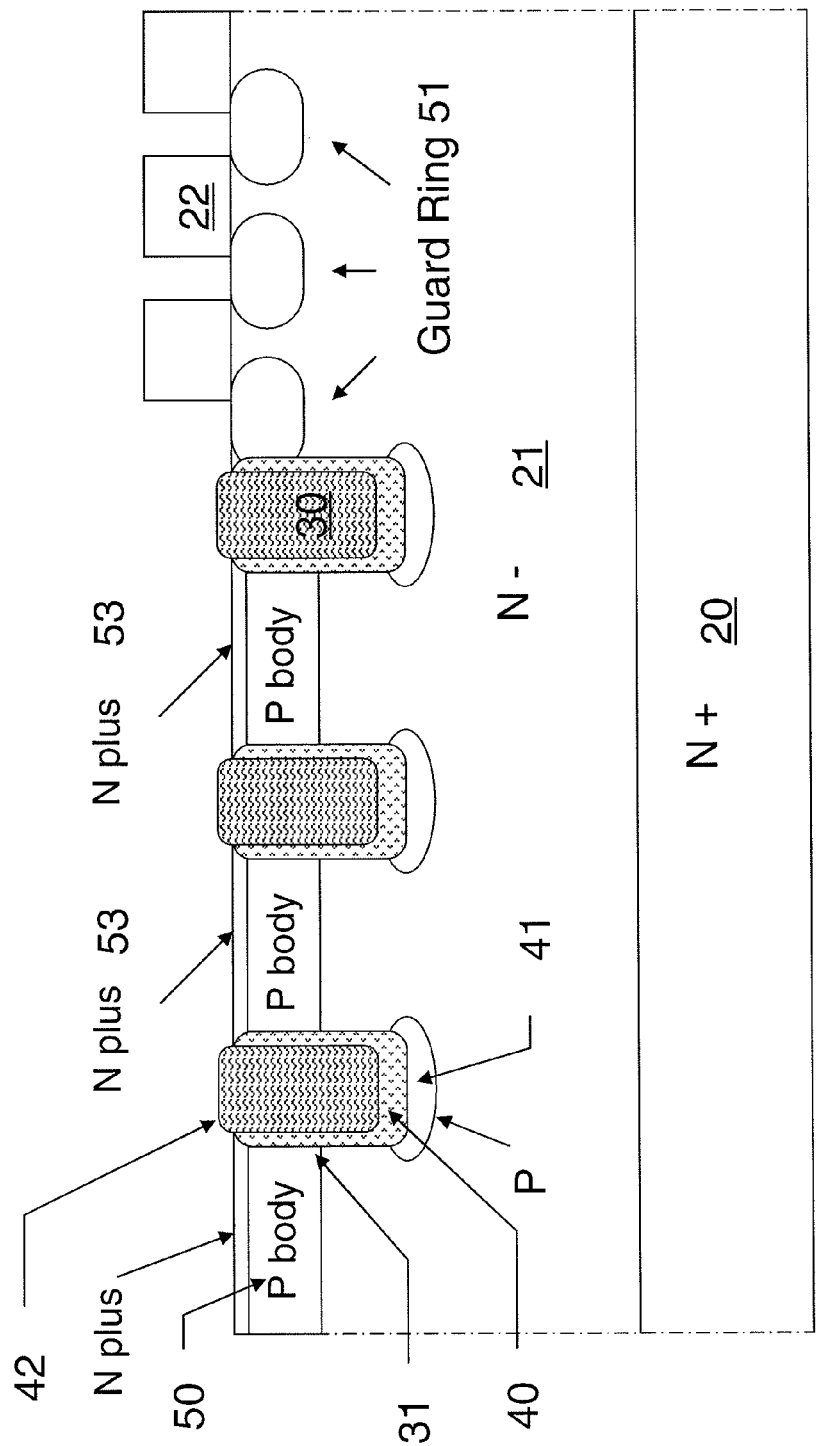
Figure 19:
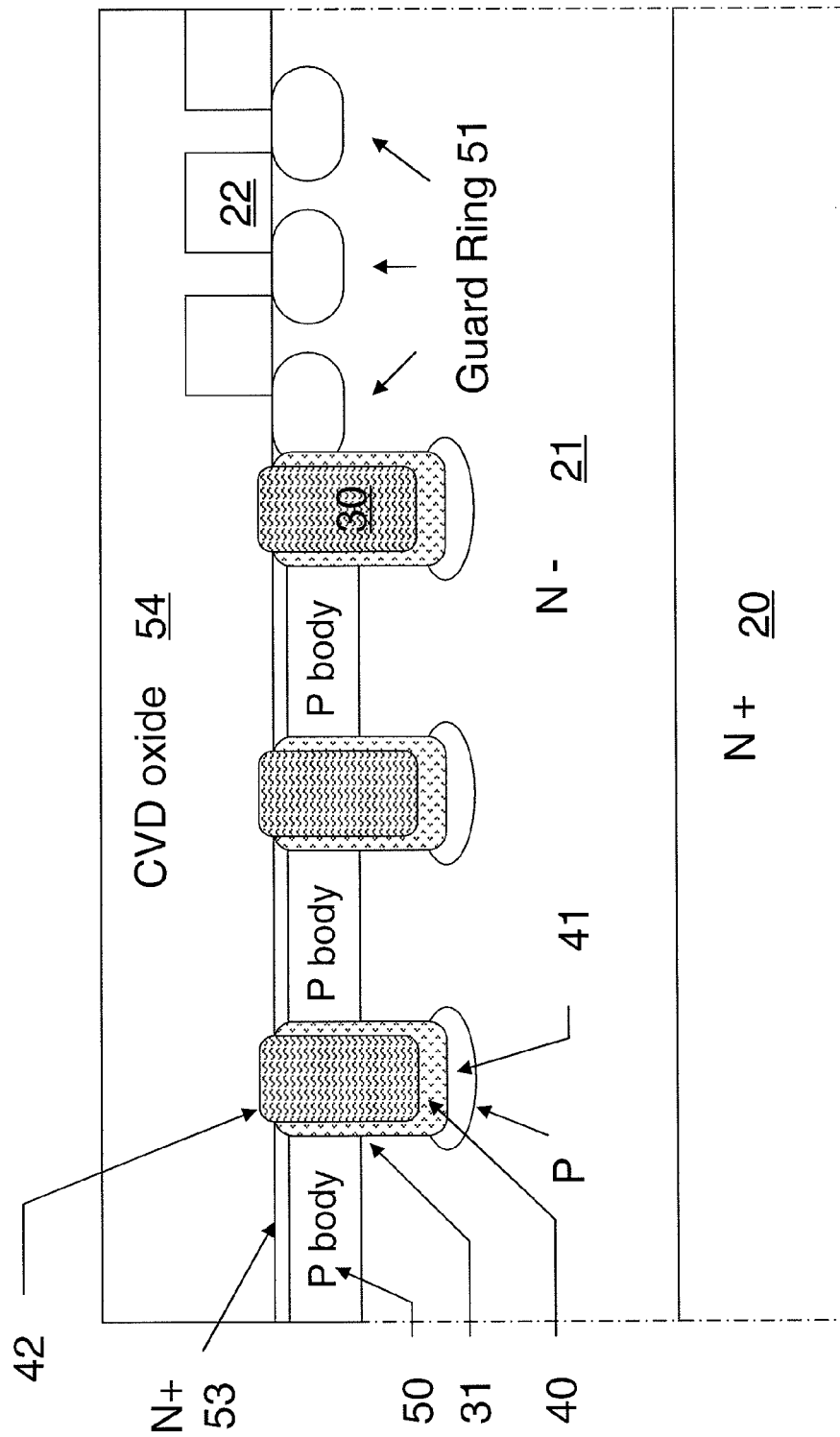

In FIG. 17, a photoresist pattern 52 is formed to cover the area outside of the device region. Then, N-type dopants, such as arsenic or phosphorus ions, are implanted with a dose of about E13-16/$cm^2$ at an energy of 10-60 KeV. After removal of the photoresist, a thermal drive-in is employed to activate the implants and form source regions 53, as shown in FIG. 18. Then, as shown in FIG. 19, a silicon oxide 54 is formed overlying the device structure in FIG. 18 by chemical vapor deposition.

Figure 20:
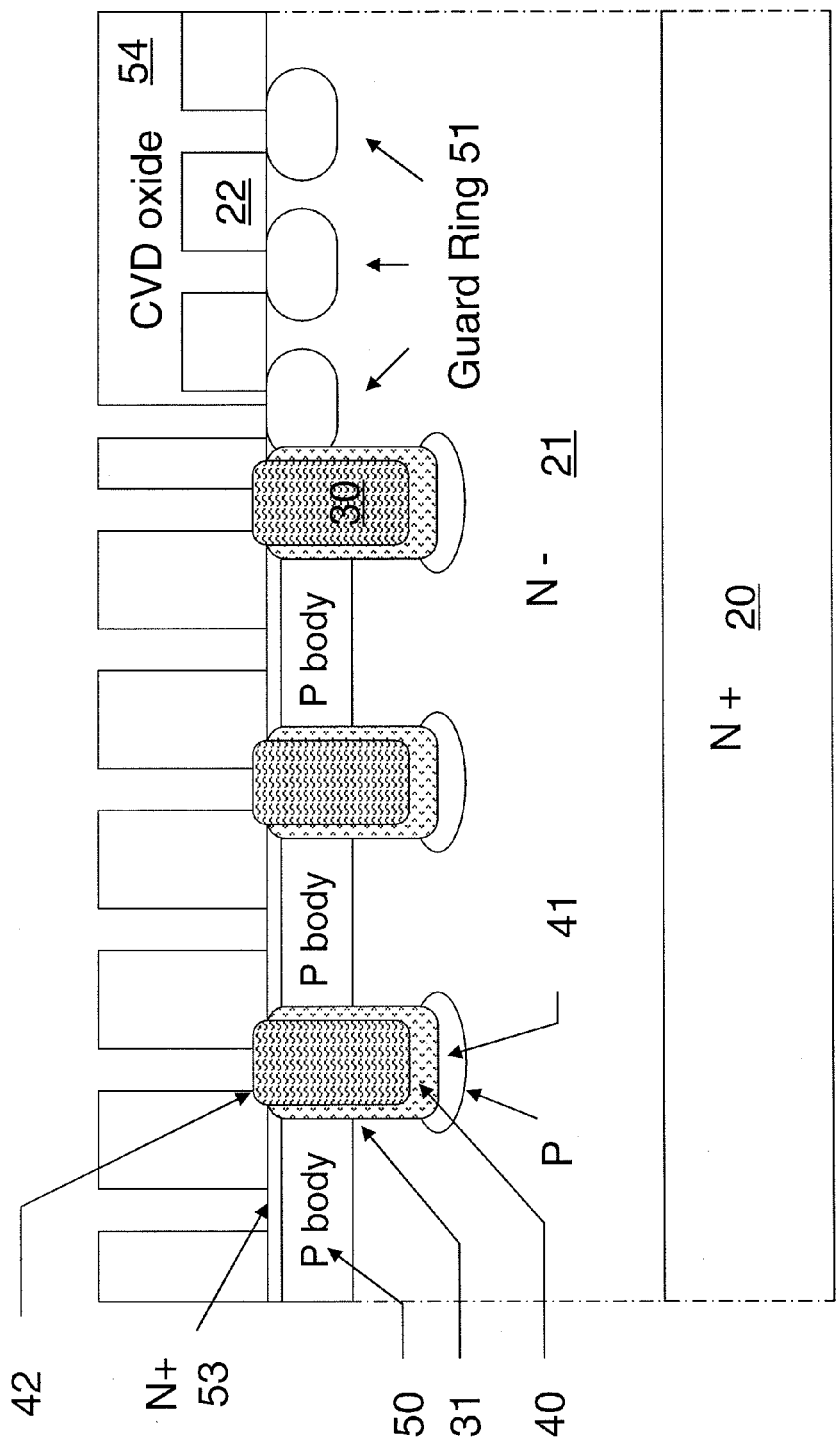
Figure 21:
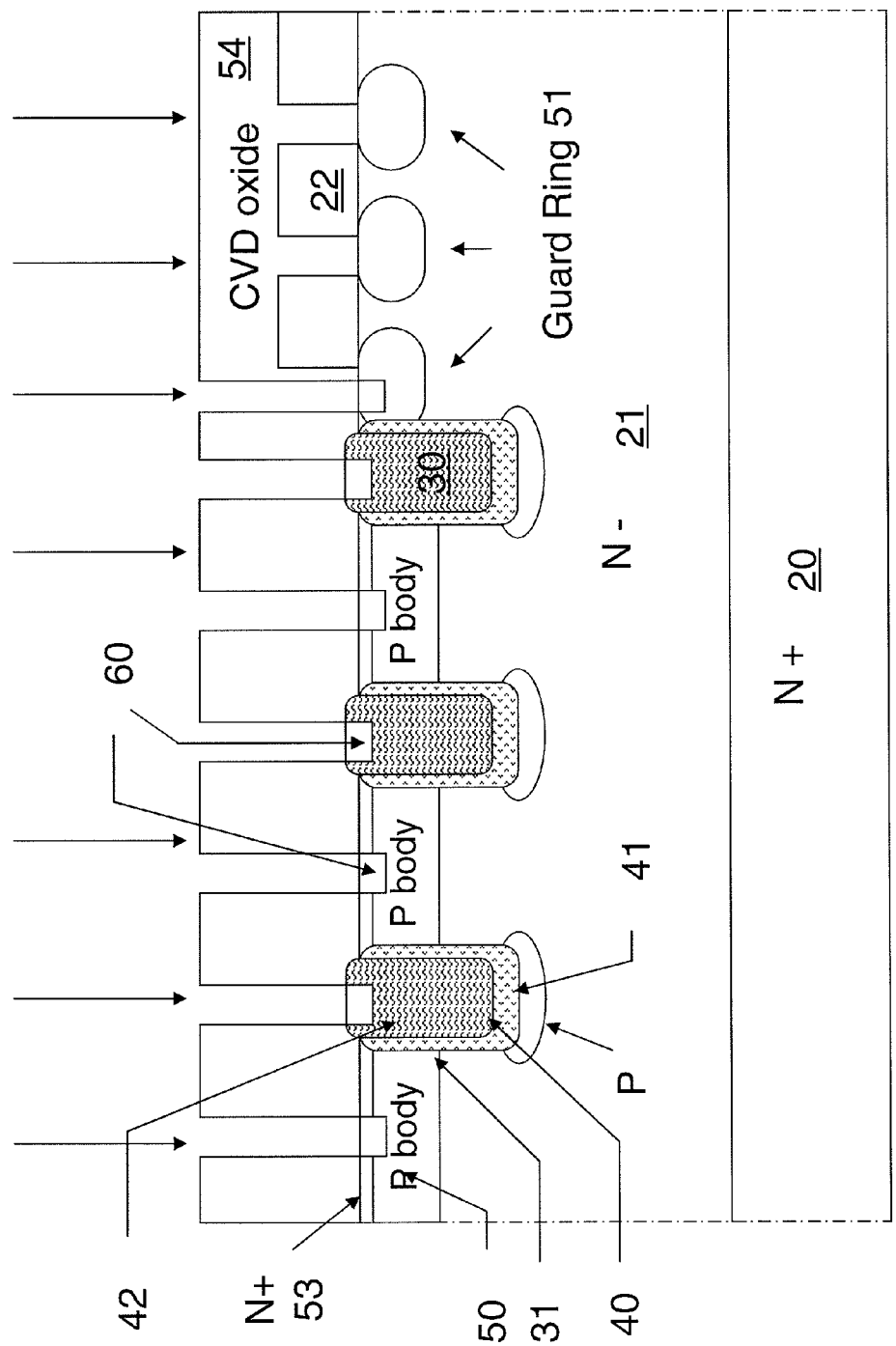

In FIG. 20, a photoresist pattern (not shown) is used to define contact areas. Then the exposed oxide in layer 54 is removed by an etch process. Thereafter, in FIG. 21 a second trench process is performed to etch the silicon regions in the mesas and the polysilicon material in the trenches to a desired depth. The second trenches 60 extend through source region 53 and into P-type body region 50 to a depth sufficient for forming contact to both the source region and the body region. A $BF_2$ implantation is carried out through the second trenches 60 into the p-body region 50, and then the $BF_2$ is activated by rapid thermal annealing. These doped regions at the bottom of the second trenches are designated as 35 in FIG. 22, which will be used to form contacts to the body regions.

Figure 22:
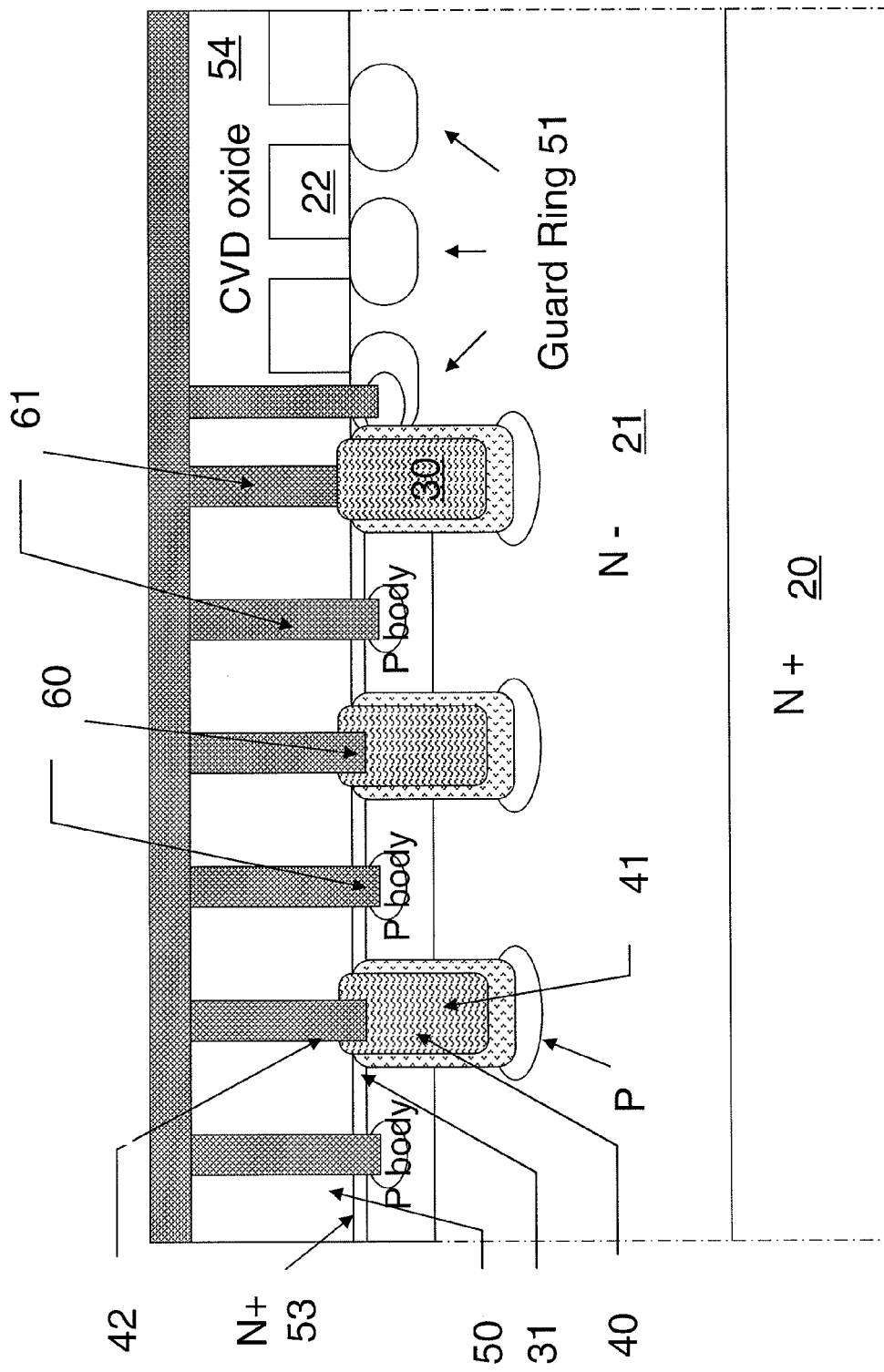
Figure 23:
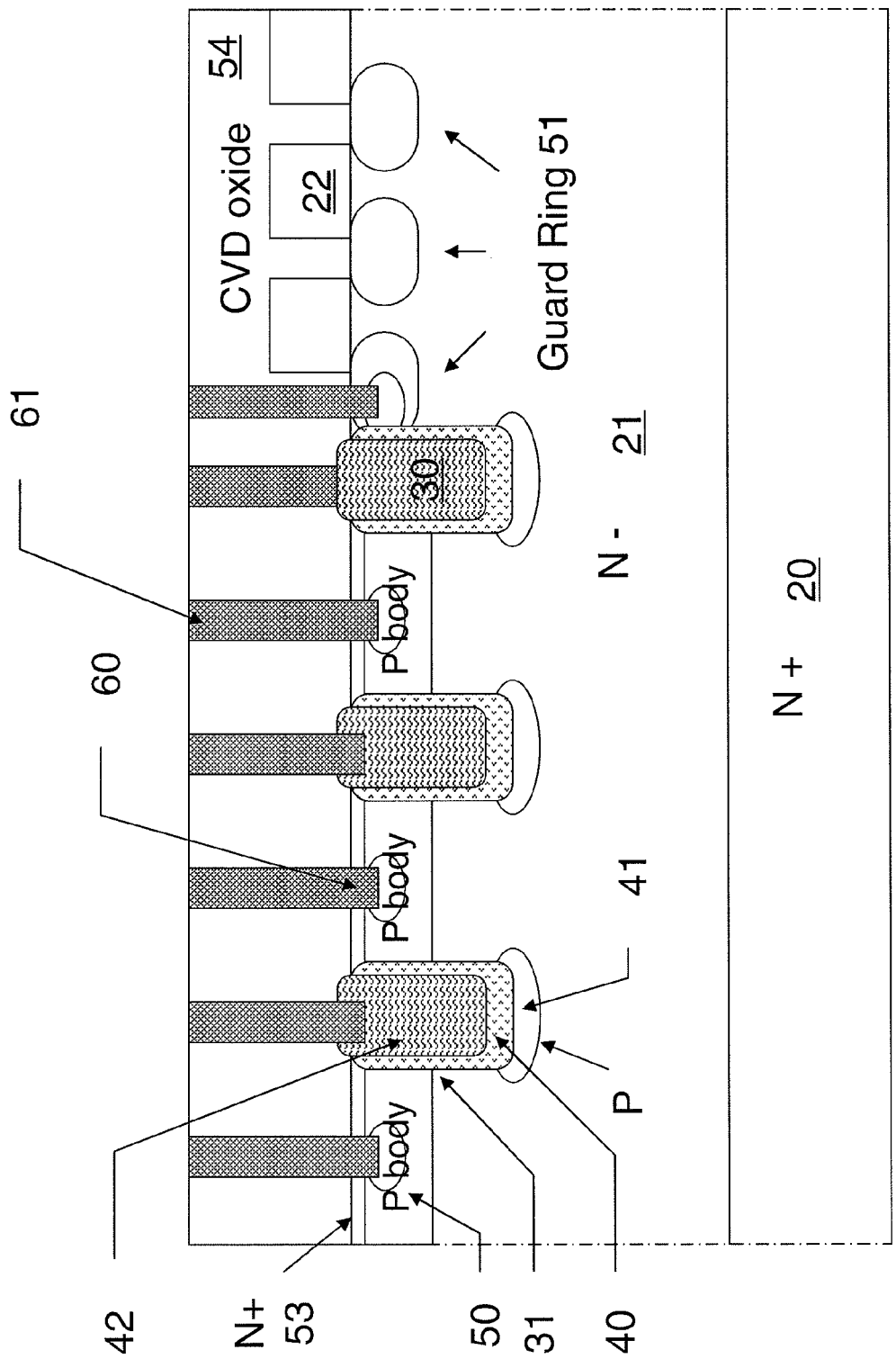
Figure 24:
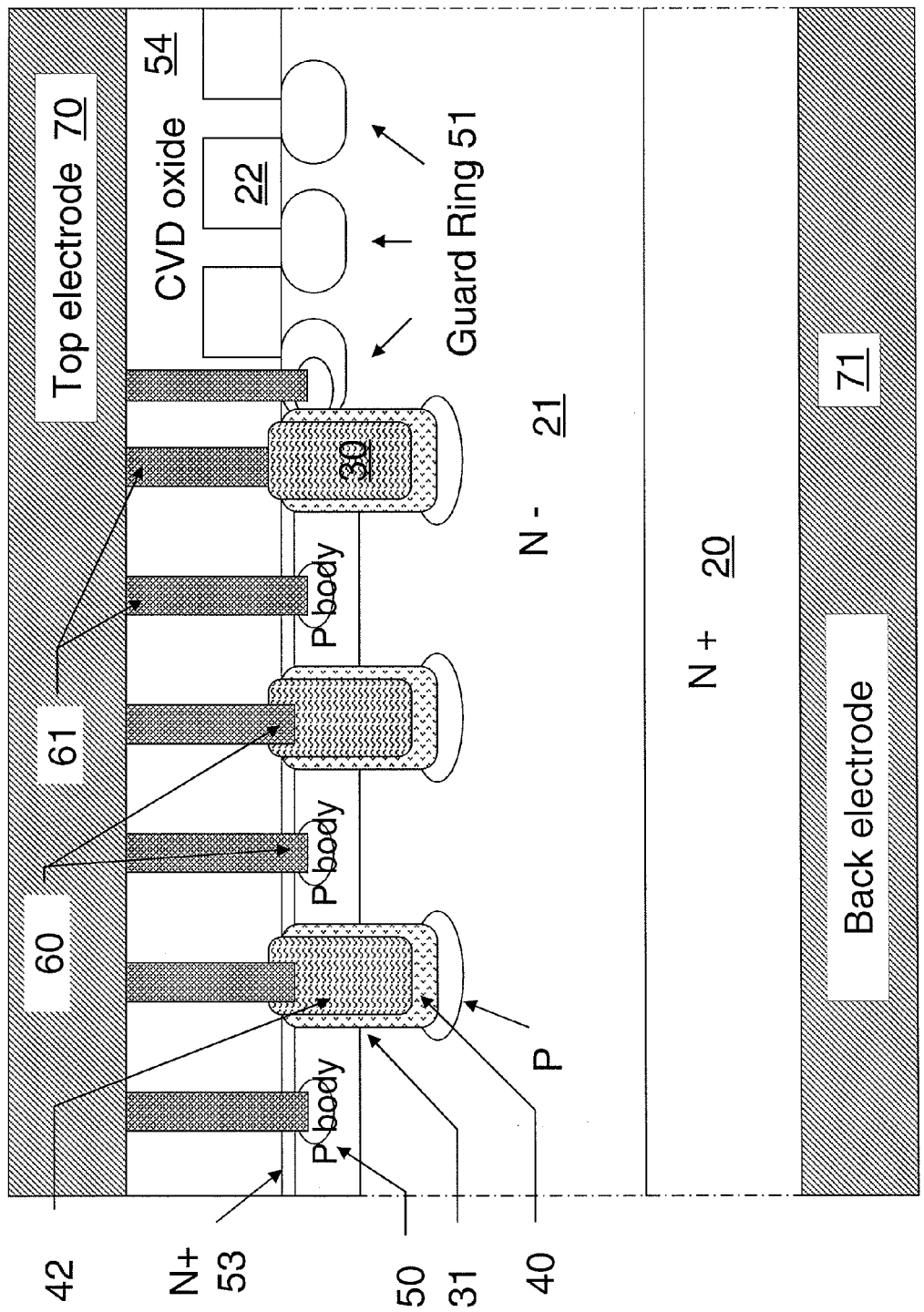

In FIG. 22, a tungsten material 61 is deposition at a thickness of approximately 1000-10000 Å on the surface of substrate to fill the second trenches 60. Then, tungsten material 61 on the surface of substrate is removed by plasma etch, with the tungsten remaining in the second trenches 60, as shown in FIG. 23. Alternatively, tungsten material 61 can also be removed from the surface regions using a chemical mechanical polishing (CMP) process. In FIG. 24, a top electrode 70 and a bottom electrode 71 are formed using a suitable conductive materials, such as Ti, TiN, Al, Ni, Ag, or a combination of some of these metals.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention.

What is claimed is:

1. A trench MOSFET rectifier device, comprising:
   a semiconductor substrate of a first conductivity type;
   a first plurality of trenches in said semiconductor substrate and spaced apart by a plurality of mesa regions;
   a source region of first conductivity type at a surface of each mesa region;
   a body region of a second conductivity type beneath each source region;
   a dielectric layer lining the bottom and sidewall surfaces, respectively, of each of the first plurality of trenches, the portion of the dielectric layer on the bottom surface being thicker than the portion on the sidewall surface;
   a doped region of the second conductivity type under the bottom surface of each of the first plurality of trenches and spaced apart from each of the body regions;
   a polysilicon gate region filling each of the first plurality of trenches;
   a conductive material in ohmic contact with the source region, the body region, and the polysilicon gate region;
   a first electrode overlying and in contact with the conductive material; and
   a drain electrode on a second surface of the substrate opposite from a first surface, said first surface being an upper main surface of the substrate.

2. The device of claim 1, wherein a thickness of the dielectric layer where said dielectric layer is lining the sidewall surface of said trench is approximately 200-800 Å and a thickness of the dielectric layer where said dielectric layer is lining the bottom surface of said trench is approximately 1000-5000 Å.

3. The device of claim 1, further comprising a termination region with at least one guard ring of the second conductivity type.

4. The device of claim 1, further comprising a second plurality of trenches, a subset of which etched through the source regions and into the body regions, another subset of which etched into the polysilicon gate regions.

5. The device of claim 1, wherein a surface of the polysilicon gate region is higher than a surface of the source region.

6. The device of claim 1, wherein the conductive material comprises tungsten.

7. The device of claim 1, wherein the polysilicon gate region is doped in the second conductivity type.

8. A trench MOSFET rectifier device, comprising:
   a semiconductor substrate of a first conductivity type;
   a first plurality of trenches along a first surface of said semiconductor substrate and spaced by a plurality of mesa regions;
   a source region of first conductivity type at a surface of each mesa region;
   a body region of a second conductivity type beneath each source region;
   a dielectric layer lining the bottom and sidewall surfaces, respectively, of each of the first plurality of trenches, the portion of the dielectric layer on the bottom surface being thicker than the portion on the sidewall surface;
   a doped region of the second conductivity type under the bottom surface of each of the first plurality of trenches and spaced apart from each of the body regions;
   a polycrystalline silicon gate region filling each of the first plurality of trenches;
   a second plurality of trenches, a subset of which being etched through the source regions and into the body regions, another subset of which being etched into each of the polysilicon gate regions;
   a conductive material filling the second plurality of trenches and being in ohmic contact with each said source region, each said body region, and each said polysilicon gate region;
   a first electrode overlying and in contact with the conductive material; and
   a drain electrode on a second surface of the substrate opposite from the first surface.

9. The device of claim 8, wherein a thickness of the dielectric layer where said dielectric layer is lining the sidewall surface of said trench is approximately 200-800 Å and a thickness of the dielectric layer where said dielectric layer is lining the bottom surface of said trench is approximately 1000-5000 Å.

10. The device of claim 8, wherein further comprising a termination region with at least one guard ring of the second conductivity type.

11. The device of claim 8, wherein a surface of the polysilicon gate region is higher than a surface of the source region.

\* \* \* \* \*